United States Patent [19]

Akiba et al.

[11] Patent Number: 4,730,271

[45] Date of Patent: Mar. 8, 1988

[54] MAGNETIC FIELD CONFIRMING CASE WITH INCLINED PORTIONS FOR MAGNETIC BUBBLE MEMORY MODULE

[75] Inventors: Yutaka Akiba, Fujisawa; Kazuo Hirota, Chigasaki; Nobuo Kishiro, Mobara; Toshio Futami, Mobara; Tatsuo Hamamoto, Mobara, all of Japan

[73] Assignee: Hitachi, Ltd., Tokyo, Japan

[21] Appl. No.: 855,392

[22] Filed: Apr. 24, 1986

[30] Foreign Application Priority Data

Apr. 26, 1985 [JP] Japan ................................. 60-88593
Apr. 26, 1985 [JP] Japan ................................. 60-88689
Apr. 26, 1985 [JP] Japan ................................. 60-88687

[51] Int. Cl.$^4$ ............................................. G11C 19/08
[52] U.S. Cl. ....................................................... 365/2
[58] Field of Search ........................... 365/1, 2, 27, 28

[56] References Cited

U.S. PATENT DOCUMENTS 4,592,015  5/1986  Akiba et al. ............................ 365/2

FOREIGN PATENT DOCUMENTS 0130283  8/1982  Japan ..................................... 365/28

Primary Examiner—James W. Moffitt
Attorney, Agent, or Firm—Antonelli, Terry & Wands

[57] ABSTRACT

A magnetic bubble memory chip is disposed at a position surrounded by a rectangular annular core having two pairs of opposite sides wound by a pair of wires, respectively, and is covered by a case for confining revolving magnetic field, thereby providing a revolving magnetic field to said chip. A bubble memory includes a permament magnet used as a holding magnetic field source, lying at a predetermined angle to the chip. An inclination between the chip and the magnet is provided on the revolving-magnetic-field confining case to be inserted between the chip and the magnet by having the case changed in plate thickness.

3 Claims, 87 Drawing Figures

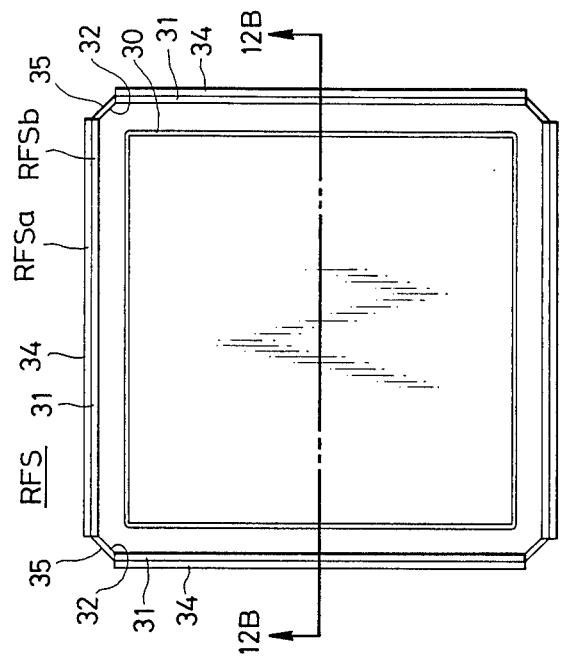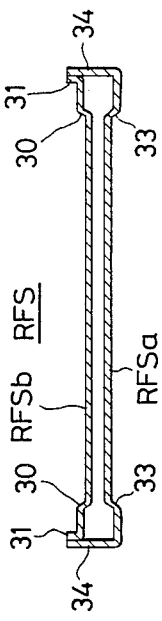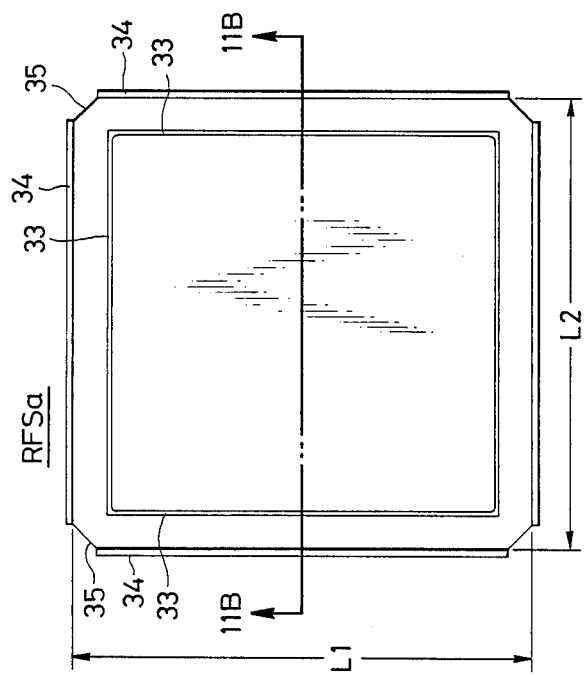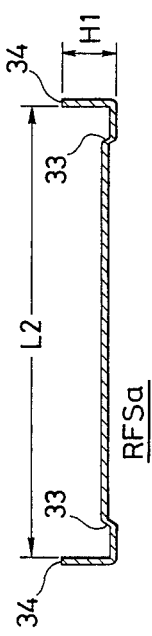

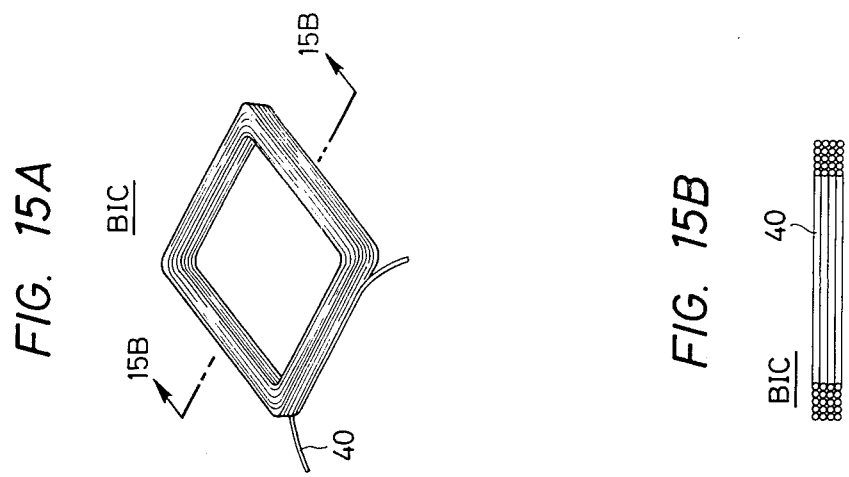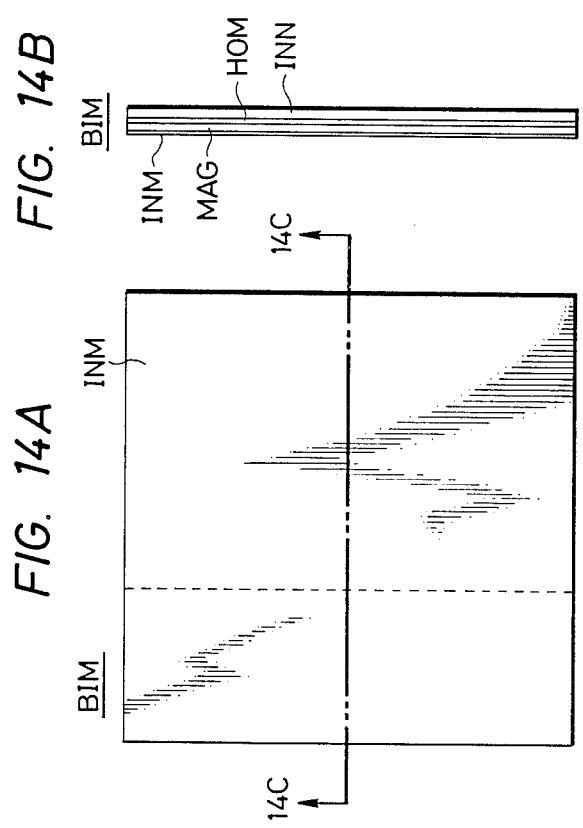

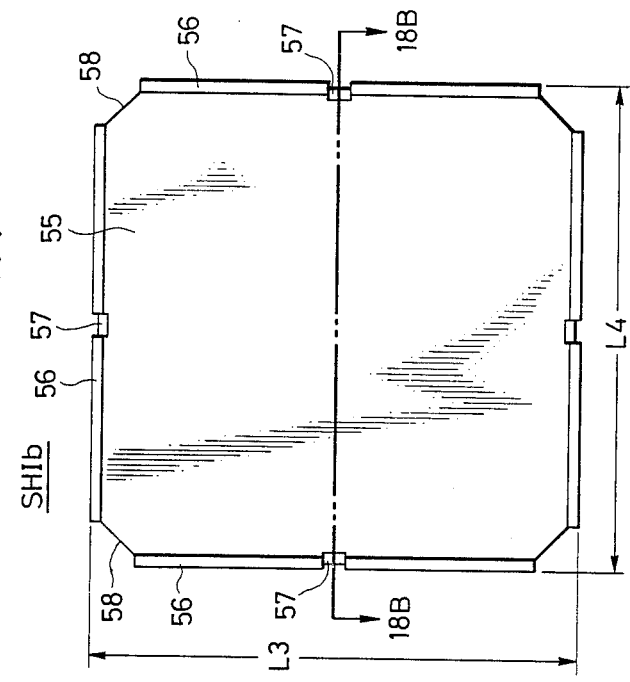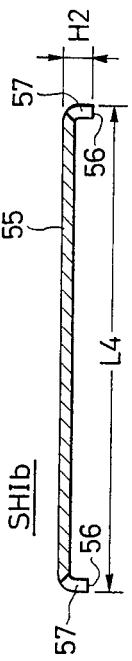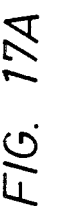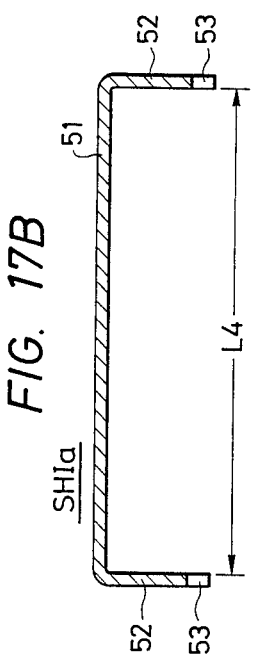

PKG

21B ← · · · · · · · · · · · · · · · · · · · · · · · · · → 21B

PKG

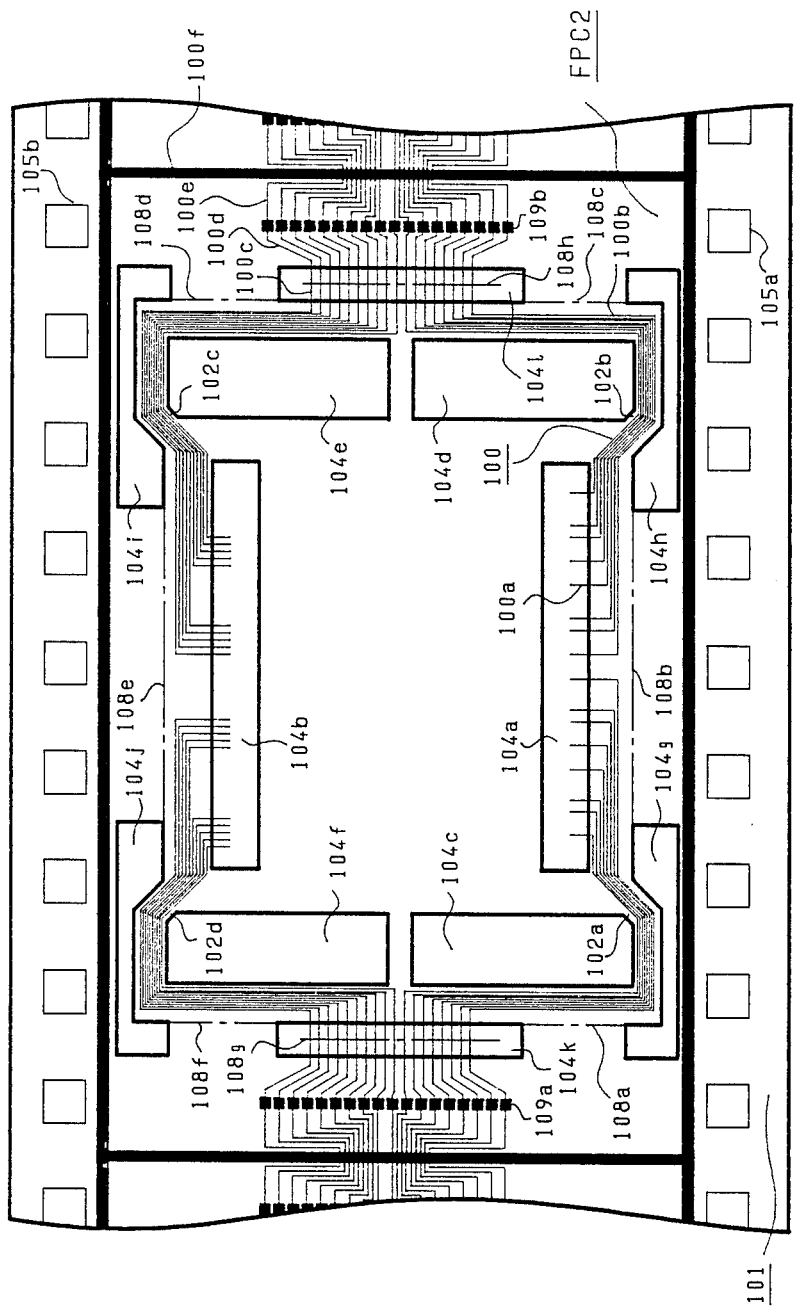

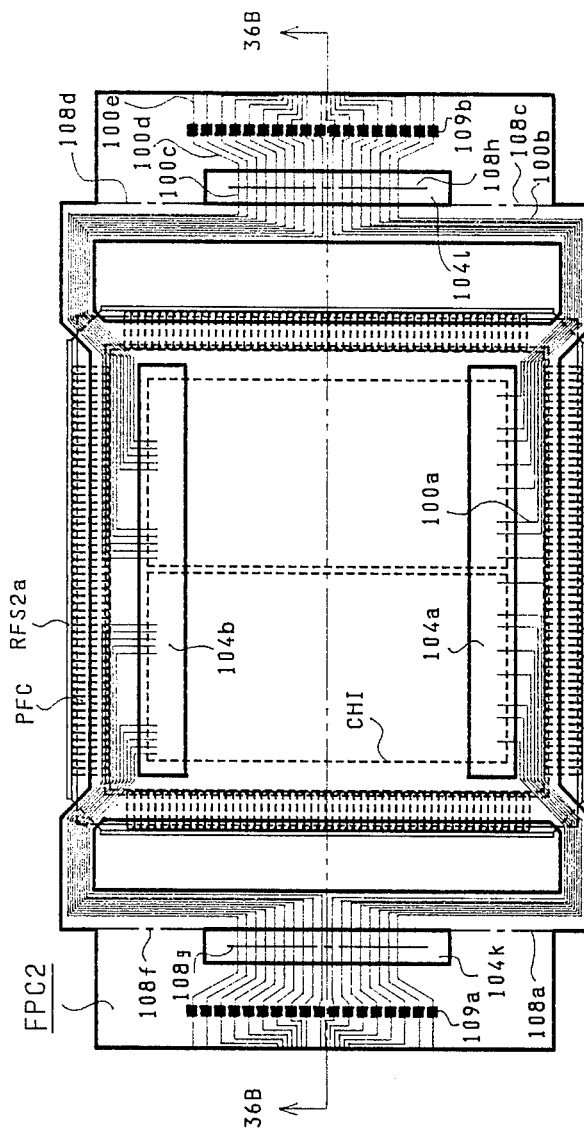
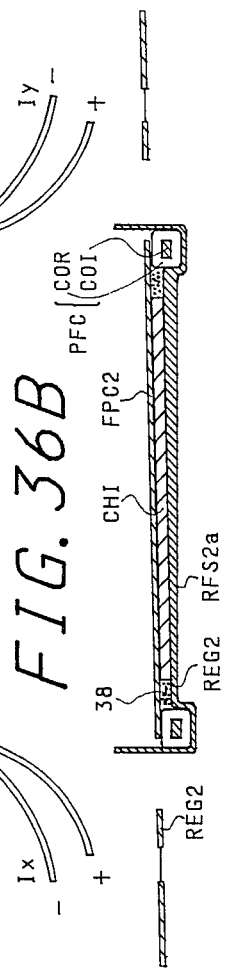
FIG.36A
FIG.36B

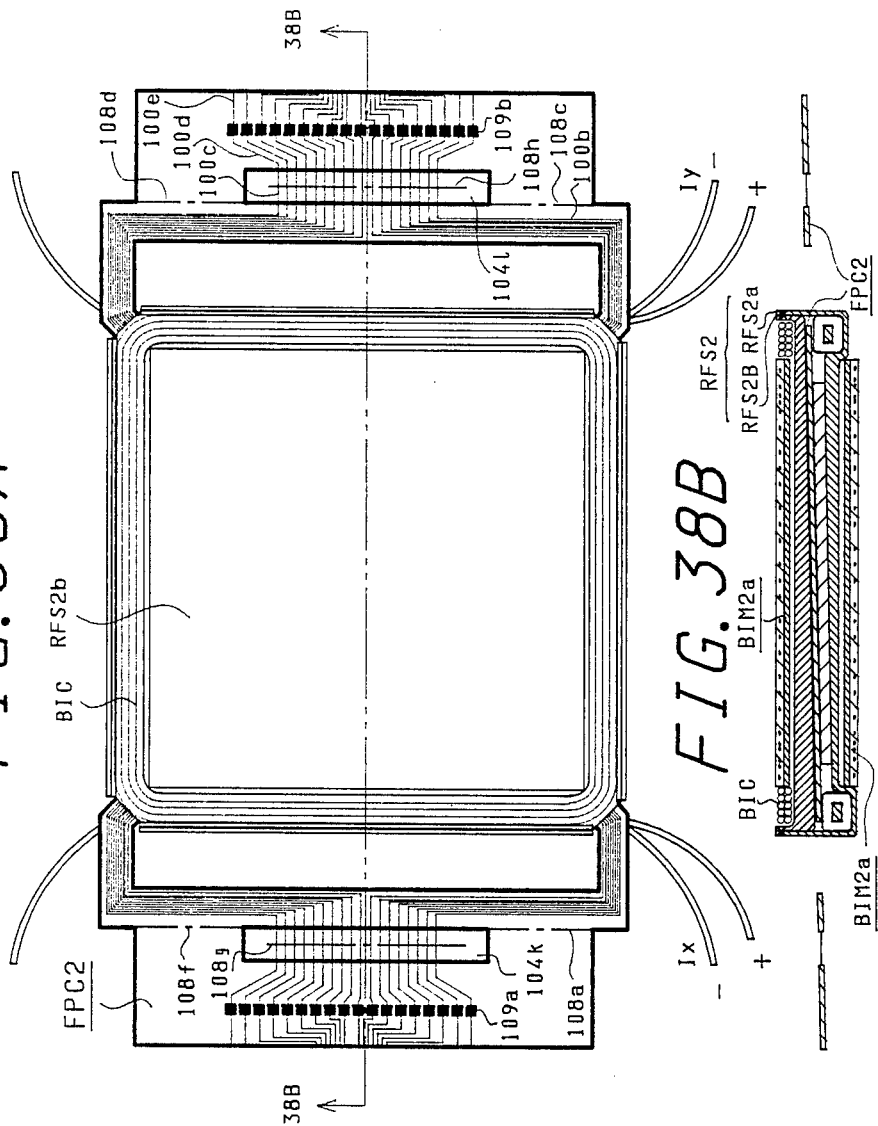

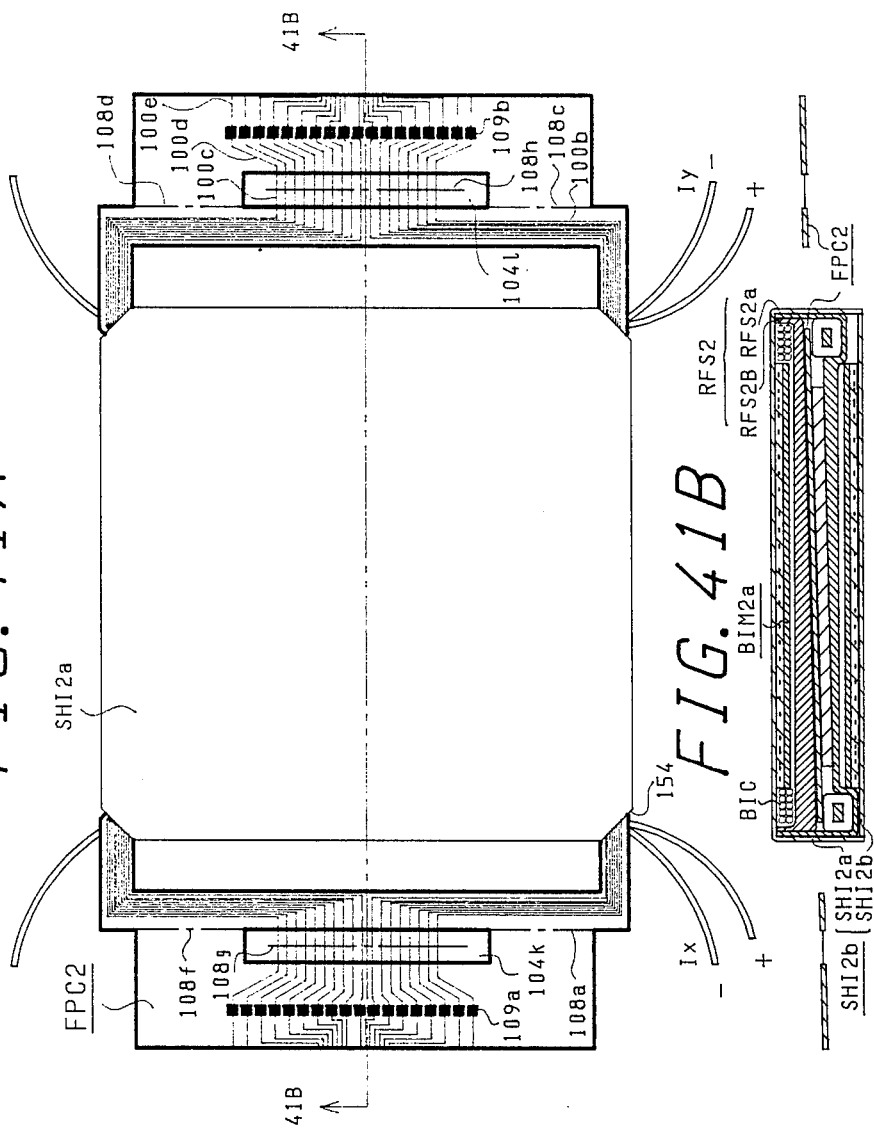

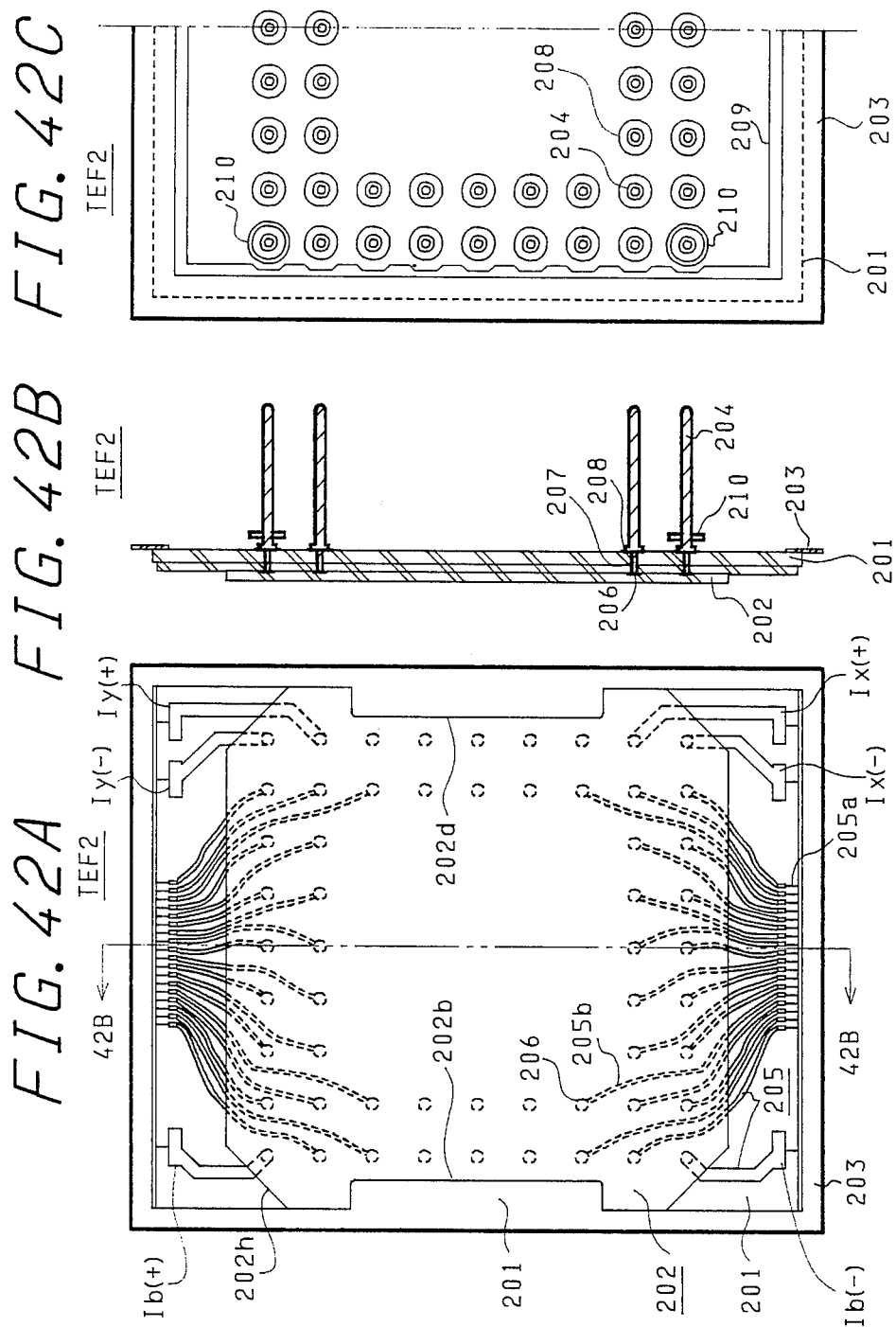

PKG2

PKG2

FIG. 45A
FIG. 45C
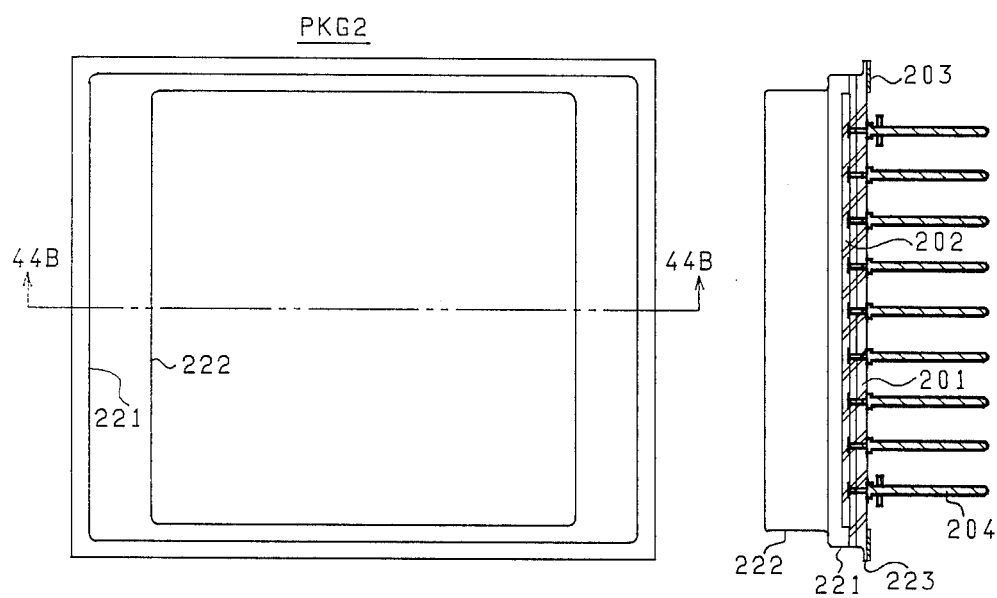
FIG. 45B
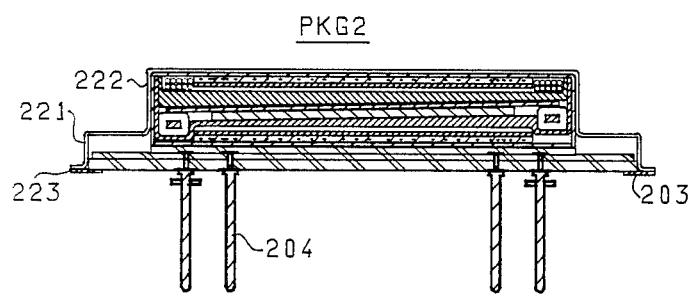

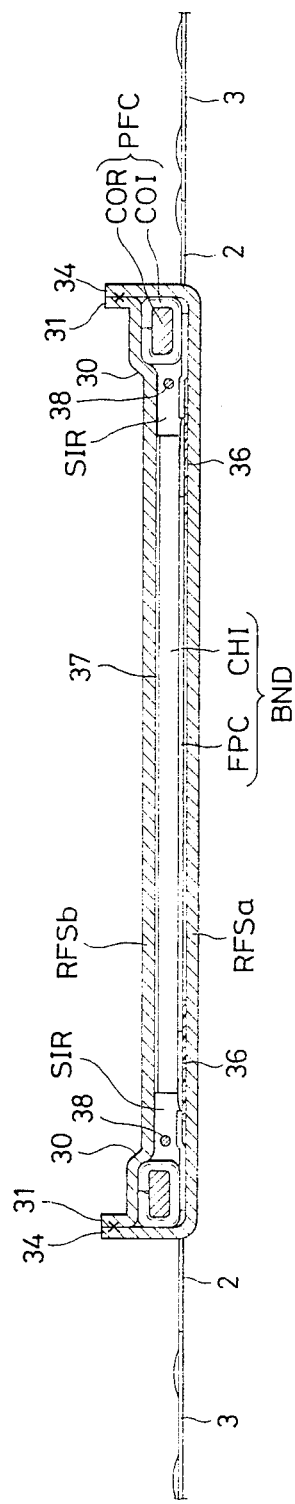
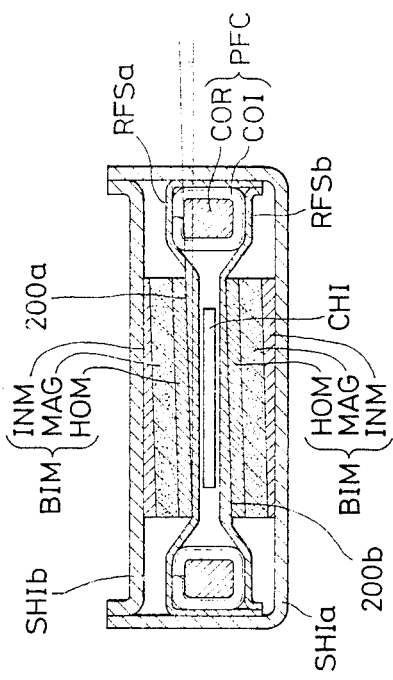
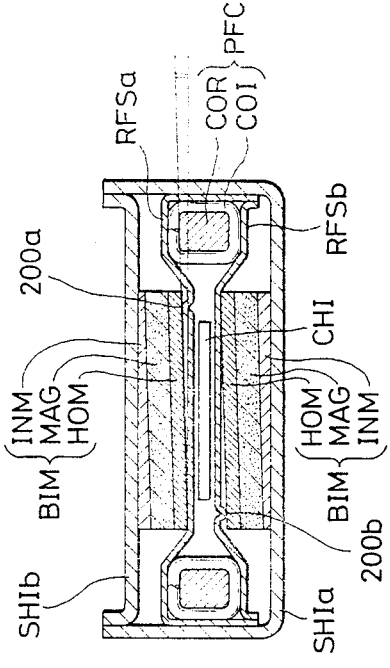
FIG. 46
FIG. 47
FIG. 48

MAGNETIC FIELD CONFIRMING CASE WITH INCLINED PORTIONS FOR MAGNETIC BUBBLE MEMORY MODULE

CROSS-REFERENCES OF THE RELATED APPLICATIONS

This application relates to:

1 an application U.S. Ser. No. 596,418 entitled "MAGNETIC BUBBLE MEMORY UNIT" by Akiba et al. filed Apr. 3, 1984 now U.S. Pat. No. 4,663,737 and assigned to the present assignee, based on Japanese Patent Applecation No. 58(1983)-57812 filed Apr. 4, 1983 and laid open to public inspection on Oct. 20, 1984 under Provisional Publication No. 59(1984)-185087;

2 an application U.S. Ser. No. 627,893 entitled "MAGNETIC BUBBLE MEMORY MODULE" by Akiba et al. filed July 5, 1984 now U.S. Pat. No. 4,592,015 and assigned to the present assignee, based on Japanese Patent Applecation No. 58(1983)-121627 filed July 6, 1983 and laid open to public inspection on Jan. 26, 1985 under Provisional Publication No. 60(1985)-15888;

3 an application U.S. Ser. No. 823,647 entitled "MAGNETIC BUBBLE MEMORY MODULE" by Akiba et al. filed Jan. 29, 1986 as well as European Patent Application No. 86101238.3 filed Jan. 30, 1986 now U.S. Pat. No. 4,694,423 and both assigned to the present assignee, based on Japanese Patent Application No. 60-16540 filed Feb. 1, 1985, Japanese Patent Application No. 60-15341 filed Jan. 31, 1985 and Japanese Patent Application No. 60-66456 filed Apr. 1, 1985 and;

4 and application U.S. Ser. No. 823,646 entitled "MAGNETIC BUBBLE MEMORY MODULE" by Akiba et al. filed Jan. 29, 1986 as well as European Patent Application No. 86101084.1 filed Jan. 28, 1986 and both assigned to the present assignee, based on Japanese Patent Applications described above 3 .

BACKGROUND OF THE INVENTION (a) Field of the Invention

The present invention relates to a magnetic bubble memory module and particularly to a magnetic bubble memory module which is suitable for thinning and miniaturizing its body lowering consumption and ameliorating efficiency of composition.

(b) Description of the Prior Art

The magnetic bubble memory module realized in these years has the structure wherein an x-coil and a Y-coil for generating a revolving magnetic field which are respectively composed of square solenoid coils having non-symmetric structures with each other are respectively inserted to E-like substrates made of ceramic, synthetic resin or the like mounting a magnetic bubble memory chip and are arranged at a right angle with each other. The X-coil and the Y-coil must be provided around not only a magnetic bubble memory chip but also a substrate which is far larger than the chip. Thus, the length from one end of each coil to the other end thereof is made longer and thus the driving voltage and the power consumption are made larger. Further, the X-coil and the Y-coil supply a uniform and stable in-plane revolving magnetic field to the magnetic bubble memory chips and thus respectively require a uniform inductor balance. Thus, these coil forms are respectively required to have non-symmetric structures which are different from each other and to have large structures. Moreover, these coils respectively have the structure wherein there are arranged on the outside surfaces of the X-coil and the Y-coil a pair of permanent magnet plates for supplying vertial bias magnetic fields to each magnetic bubble memory chip and the plates for homogenizing their magnetic fields and these peripheral portions are covered with resin molds. Accordingly, their lamination thicknesses in the vertical direction are made larger and this enlargement has been made to be an obstacle to requirements for thinning and miniaturizing a magnetic bubble memory module.

As the closest prior art to the present invention of which the present inventors are aware, it is possible to cite the invention of U.S. Pat. No. 4,165,535. This specification discloses a structure of a picture frame core surrounding a chip and a conducting box for reflecting a magnetic field completely surrounding the core and the chip. However, it does not disclose more concrete structure than the above any more. For example, it is theoretically impossible to carry out electrical connection to a chip completely surrounded by a conductor case from the outside of the conductor case without short-circuitting with the conductor case. Further, it does not clearly disclose the method of mounting a permanent magnet, a plate for homogenizing a magnetic field, a bias coil and the like. Accordingly, the disclosure is apparently insufficient to be considered as a hint for trying to realize the present invention. Namely, as a result, the embodiment of the present invention just happens to coincide with the disclosure of the above-stated specification in the respect of employing a picture frame core for the embodiment of the present invention.

SUMMARY OF THE INVENTION

It is an object of the present invention to provide a magnetic bubble memory module which is designed to be thinned.

It is another object of the present invention to provide a magnetic bubble memory module which is designed to be miniaturized by making its overall bulk smaller.

It is a further object of the present invention to provide a magnetic bubble memory module which is designed to reduce its power consumption.

It is yet another object of the present invention to provide a magnetic bubble module which is designed to make a VI product smaller by diminishing inductance of a coil for generating a revolving magnetic field.

It is a still further object of the present invention to provide a magnetic bubble module which makes it possible or easier to be automated by ameliorating efficiency of composing components.

It is still another object of the present invention to provide a magnetic bubble module which has a capability of increasing connection terminals for inputs and outputs and the like in number in order to realize enlargement of the capacity and the like.

It is another object of the present invention to provide a magnetic bubble module which has a capability of easily and highly accurately arrange a gradient angle to the direction of a bias magnetic field of a magnetic bubble memory chip.

It is another object of the present invention to provide a magnetic bubble module which has a capability of miniaturizing a cassette.

It is further another object of the present invention to provide a magnetic bubble module which is designed to ameliorate uniformity of a revolving magnetic field.

According to one embodiment of the present invention, a magnetic bubble memory chip is disposed at a position surrounded by a rectangular annular core having two pairs of opposite sides wound by a pair of wires, respectively, and is covered by a case for confining revolving magnetic field, thereby providing revolving magnetic field to said chip. In a bubble memory, on the other hand, a permanent magnet is used as a holding magnetic field source, lying at a predetermined angle to the chip. In the present invention, an inclination between the chip and the magnet is provided by forming projections on the revolving-magnetic-field confining case to be inserted between the chip and the magnet, or by having the case changed in plate thickness.

BRIEF DESCRIPTION OF THE DRAWINGS

FIG. 2 includes FIGS. 2A and 2B.

FIG. 11 includes FIGS. 11A and 11B which are views showing an outer case RFSa.

FIG. 12 include FIGS. 12A and 12B showing an assembly drawing of the case RFS.

FIG. 14 includes FIGS. 14A–14C which are views describing the construction of a magnet BIM.

FIG. 15 includes FIGS. 15A and 15B which are views describing a bias coil BIC.

FIG. 17 includes FIGS. 17A and 17B which are views showing an outer shield case SHIa.

FIG. 18 includes FIGS. 18A and 18B which are views showing an inner shield case SHIb.

FIG. 29 includes FIG. 29A and 29B.

FIG. 32 shows a modified embodiment of a flexible substrate.

FIG. 33 includes FIGS. 33A–33C showing the inner case RFS2b, where

FIG. 34 includes FIGS. 34A–34C showing the outer case RFS2a, where

FIG. 36 includes FIGS. 36A and 36B showing the status of the chip CHI, the flexible substrate FPC2, and the magnetic circuit PFC accommodated in the outer case RFS2a.

FIG. 37 includes FIGS. 37A–37C showing the magnet body BIM2, where

FIG. 38 includes FIGS. 38A and 38B showing the status of the magnet body BIM2 shown in FIG. 37 and the bias coil BIC shown in FIG. 15 accommodated in the case assembly RFS2 described with reference to FIG. 36, where FIG. 38A is a plan view and FIG. 38B is a sectional view taken on the line 38B—38B.

FIGS. 39 includes FIGS. 39A–39C showing the upper shield case SHI2a, where

FIG. 40 includes FIGS. 40A and 40B showing the lower shield case SHI2b, where

FIG. 41 includes FIGS. 41A and 41B showing the magnetic shield cases SHI2a and SHI2b shown in FIG. 39 and FIG. 40 packaged therein with the intermediate assembly shown in FIG. 38, where FIG. 41A is a plan view and FIG. 41B is a sectional view taken on the line 41B—41B.

FIG. 42 includes FIGS. 42A–42C showing a substrate for electrically connecting the shield case assembly shown in FIG. 41 to the pin grid external connection terminal, where FIG. 42A is a plan view, FIG. 42B is a sectional view taken on the line 42B—42B, and FIG. 42C is a bottom view.

FIG. 43 includes FIGS. 43A and 43B showing the status when the shield case assembly shown in FIG. 41 is packaged on the pin grid substrate TEF2 shown in FIG. 42, where

FIG. 44 includes FIGS. 44A and 44B showing an encapsulation cap, where

FIG. 45 includes FIGS. 45A–45C showing the finished structure of a series of modified embodiments described with reference to FIG. 32 thru FIG. 44, where FIG. 45A is a plan view, FIG. 45B is a sectional view taken on the line 45B—45B and FIG. 45C is a right side view.

FIG. 46 is a sectional view showing an assembly case RFS of a modified embodiment 2 of the present invention in which the substrate assembly BND and the magnetic circuit PFC are accomodated.

FIG. 47 is a sectinal view showing an assembly case SHI of a modified embodiment 3 of the present invention.

FIG. 48 is a sectional view showing an assembly case SHI of a modified embodiment 4 of the present invention.

DETAILED DESCRIPTION OF PREFERRED EMBODIMENT

Next, the embodiments of the present invention will be described with reference to the drawings.

Figure 1:
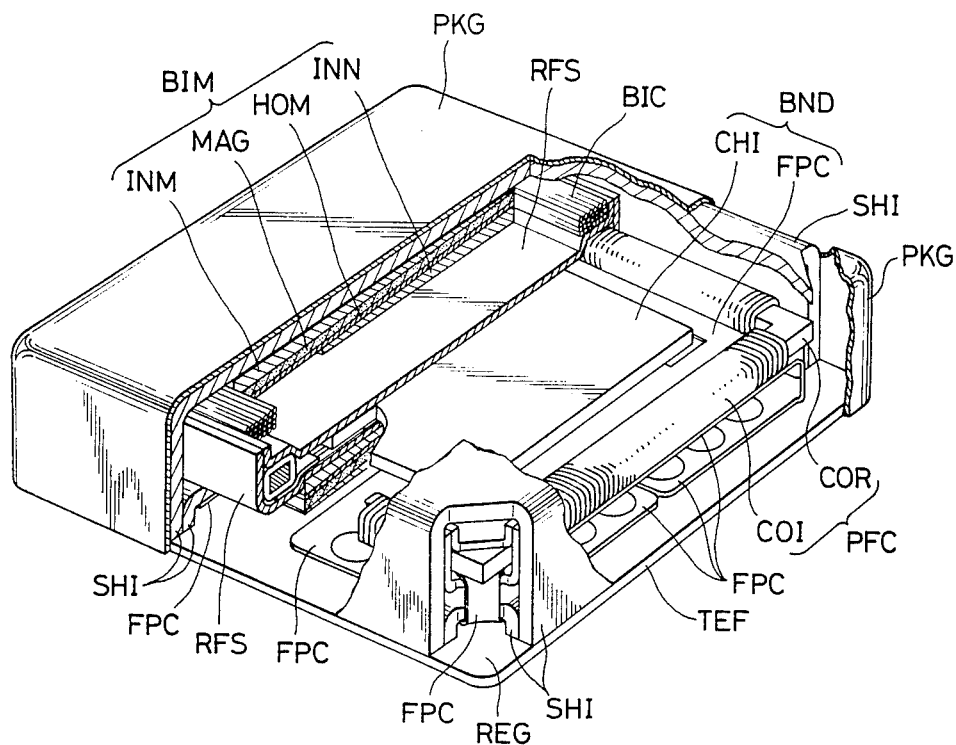
FIG. 1 is a partially broken perspective view showing an overall magnetic bubble memory module of the present invention.

(Summary of the overall structure; FIGS. 1 and 2)

Figure 2A:
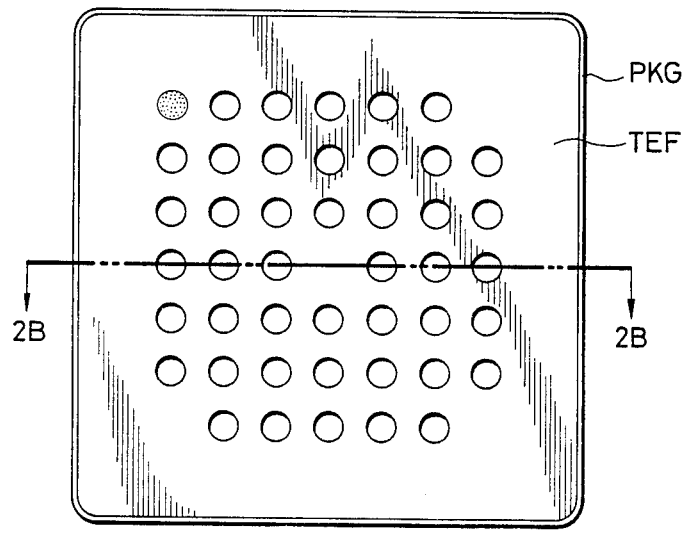
FIG. 2A is a bottom view.
Figure 2B:
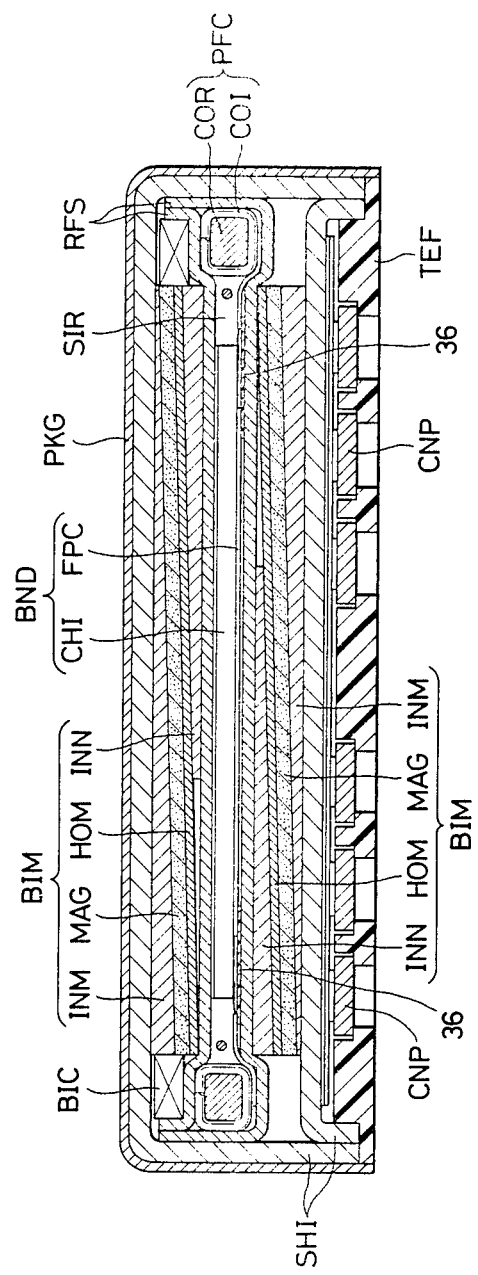
FIG. 2B is a sectional view on line 2B—2B of FIG. 2A.

FIGS. 1 and 2A and 2B are views for describing one embodiment of a magnetic bubble memory module according to the present invention. FIG. 1 is a partially broken perspective view. FIG. 2A is a bottom view thereof. FIG. 2B is a sectional view on the line 2B—2B of FIG. 2A. In these drawings, CHI denotes a magnetic bubble memory chip (hereinafter, referred as to a chip). IN these drawings, only one chip CHI is shown by deleting the other, but in the present embodiment, it is to be understood that two chips are disposed side by side. (It is possible to obtain more excellent chip yielding by employing the construction wherein plural chips cover storage capacity conforming to a total of storage capacity than by employing one chip construction). FPC denotes a flexible substrate loaded on two chips CHI and having line group extensions for connecting between the chip CHI and an outer connection terminal at four corners (hereinafter, referred as to a substrate).

COI denotes a driving coil surrounding two chips CHI in the almost same level therewith and disposed to make the opposite sides parallel with each other (hereinafter, referred as to a coil). COR denotes a picture frame core made of soft magnetic materials fixedly disposed so as to penetrate through a hollow portion of a square coil assembly COI (hereinafter, referred as to a core). This core COR and respective coils COI compose a magnetic circuit PFC for supplying an in-plane revolving magnetic field to the chip CHI.

RFS denotes a case for confining a revolving magnetic field which serves to accomodate a central square part of the substrate FPC and the while two chips CHI and magnetic circuit PFC (hereinafter, referred as to a case). The case RFS is formed by working two dependent plates and the upper and the lower plates are electrically connected at the side sections of the case. In this case RFS, there is formed a drawn section around the case so as to narrow a gap of a central part in a somewhat wider range than the part on which the chip CHI is disposed. This drawn section can be utilized for positioning a magnet stated after. The case RFS has two effects, that is, functions of confining a revolving magnetic field and mechanically supporting a weak substrate FPC.

Between the case RFS and the chip CHI, there exists a gap SIR especially at the sides of the chip CHI. However, silicon resin is coated on or filled with this gap SIR together with a plane section so as to try to bring about a passivation effect for the purpose of avoiding attaching extra things on the main surface of the chip when assembling the case and of lessening invasion of water on the main surface of the chip or the side sections thereof after assembling it. If airtight sealing is completely carried out at the outside of the case RFS, it is possible to delete the step of filling resin with the gap SIR.

INM denotes a pair of inclined plates made of magnetic materials disposed at the outside of the case RFS. In FIG. 2, the thickness of the upper side of the inclined plate INM is gradually made larger toward the left and that of the lower side of the inclined plate INM is gradually made larger toward the right. Both plates form inclined surfaces at the side of the case RFS. It is possible to employ materials with high permeability and small retentiveness Hc such as soft ferrite, Permalloy or the like as the materials of the inclined plate INM. In the present embodiment, soft ferrite is selected since it serves to facilitate working the inclined surfaces. MAG denotes a pair of permanent magnet plates disposed as putting each of them on the corresponding inside of a pair of inclined plates INM (hereinafter, referred as to a magnet plate). HOM denotes a pair of plates for homogenizing a magnetic field disposed as putting each of them on the corresponding inside of said each magnet plates and made of magnetic materials such as ferrite or the like. The magnet plate MAG is formed to wholly have an uniform thickness. INN denotes a pair of inclined plates disposed as putting each one of them on each corresponding inside plate of said plates for homogenizing a magnetic field and made of non-magnetic materials with excellent thermal conductivity. These inclined plates INN are formed to have the almost same gradient with that of the inclined plate INM and the inclined surfaces in the reverse directions to them. The inclined plate INM, the magnet plate MAG, the plate HOM for homogenizing a magnetic field and the inclined plate INN are disposed as piling them and integrated so as to compose a magnet body BIM for generating a bias magnetic field (hereinafter, referred as to a magnet body), when the magnet body composed of laminated plates is formed to uniformly have the overall thickness. A pair of magnet bodys BIM are attached on a central plane section surrounded by the drawn sections of the case RFS.

BIC denotes a coil for generating a bias magnetic field disposed in a groove-like gap section between a peripheral portion of the magnet body BIM and the case RFS (hereinafter, referred as to a bias coil). The bias coil BIC is driven in case of arranging magnetism of the magnet plate MAG in accordance with the characteristics of the chip CHI or clearing all the bubbles of the chip CHI when there is accomplished the test as to fault of unnecessary-bubbles-generating.

SHI denotes an outer magnetic shield case made of magnetic materials and for accomodating the case RFS in which the substrate loaded with said chip CHI and the magnetic circuit PFC are accomodated and, at the outside of the case, a pair of magnet bodys BIMa, BIMb and the bias coil BIC (hereinafter, referred as to a shield case). For the materials of the shield case SHI, it is preferable to employ the magnetic materials with high permeability $\mu$, large saturated flux density Bs and small retentiveness Hc. Permalloy or ferrite has such a characteristic, but the present embodiment selects iron-nickel alloy of Permalloy which is suitable for bending operation and can endure mechanical external force.

RKG denotes a packaging case made of materials with high thermal conductivity and workability such as aluminum and mounted on the outer peripheral surface of said shield case SHI by attaching or engaging. CNP denotes a contact pad provided as extended from the four corners of said substrate FPC and disposed to be in contact with an outer connection terminal bent out to the rear surface of the shield case SHI. TEF denotes a terminal-fixing plate made of insulating materials and for fixedly supporting each contact pad CNP at an interstage portion of the opening. REG denotes resin mold agent enclosed at the inside four corners of the packaging case PKG and for fixing the assembly of the shield case SHI to the inside of the packaging case PKG.

(Features of the overall structure; FIGS. 1 and 2)

It is possible to list the features of the magnetic bubble memory module shown in FIGS. 1 and 2 as follows. However, the features of the present embodiment should not be defined as follows. The other features will be obvious from the descriptions stated after FIG. 3, but, herein, the features are referred as mainly taking relations among respective components.

(1) Since the magnetic circuit PFC for generating a revolving magnetic field is made to be a picture frame type and the bubble memory chip CHI is arranged to be on the almost same level with the picture frame and within the frame, the thickness of the overall bubble module can be made thin. In the current techniques in these days, the X- and Y-coils are provided around the upper and the lower surfaces of the chip. Thus, the thickness of the overall device is a function of a sum of a chip thickness, a X-coil thickness and a Y-coil thickness.

(2) Since the X-coil and the Y-coil are disposed on the almost same level with each other, the following effects can be brought about in comparison with the conventional structure wherein the Y-coil is provided around the X-coil.
1  The length of total windings of a coil is not made as long. Thus, it is possible to lower inductance L and to realize the lowering of a driving voltage and power consumption.
2  Since the distances between the chip CHI and the X-coil and between the chip CHI and the Y-coil are made to be equal to each other, it is possible to take a balance of a distribution of a magnetic field (amelioration of uniformity).

(3) The magnetic circuit PFC for generating a revolving magnetic field is surrounded by the case RFS. Thus, the leakage of a magnetic flux can be hardly brought about and thus it is possible to heighten driving efficiency in relation to the chip CHI.

(4) The case RFS has selectivity, that is, it serves to prevent leakage of an alternating magnetic field generated in the coil COI for generating a revolving magnetic field to the magnet body BIM with large permeability $\mu$ and on the contrary not to prevent substantial passage of a series magnetic field in the bias magnetic field Hb to be added from the magnet body BIM to the chip CHI (5) The case RFS employs harder materials such as copper in comparison with epoxy glass or the like conventionally utilized as a substrate. Thus, it is possible to mechanically, that is, strongly support the chip CHI. Accordingly, in case of employing a plural-chips-mounting arrangement on account of raising a producing yield, the difference of a gradient between the chips serves to greatly influence a magnetic characteristic, but the present embodiment can suppress the difference of a gradient between the chips low.

(6) Since the flexible substrate FPC is employed as a substrate, the following effects can be obtained.
1  The substrate thickness can be made small.
2  This embodiment can employ a lead bonding method. Thus, it is possible to make the thickness of the bonding portion smaller in comparison with the conventional wire bonding method.
3  The above-stated effects 1 and 2 serve to make a gap of the magnetic circuit (the part with small permeability $\mu$) smaller and to employ the magnet plate MAG having a small thickness or a small plane area. They can be brought to thinning the overall module or reducing a plane area.
4  It is possible to freely bend wirings from the chip CHI. Thus, it is possible to turn a terminal section out about 180° and to restrict the plane area of the overall module.
5  It is possible to diminish in size the width of an opening for picking up wirings of the case RFS for confining a revolving a magnetic field. Thus, the leakage of a revolving magnetic field can be minimized.

(7) The outer lead-out wirings of the substrate FPC are aggregated at the corner sections of the square. Thus, it is possible to provide an opening of the case RFS for confining a revolving magnetic field at the corner section which is least influenced.

(8) Since the function of the inclined plate INN does not have both functions as a magnet and homogenizing a magnetic field, the following effects can be brought about.
1  It is possible to employ materials with excellent workability such as copper or the like in order to form a gradient.
2  It is possible to employ materials with excellent thermal conductivity such as copper or the like and to efficiently dissipate the heat generated in the coil COI for generating a revolving magnetic field.
3  By using non-magnetic materials, it is possible to prevent disturbance of a magnetic field passed through the plate HOM for homogenizing a magnetic field.

(9) It is preferable to thin the inclined plate INN as much as possible in order to diminish a magnetic gap. By restricting the width of the plate INN so as to be a required and sufficient value for forming a gradient more than those of the magnet plate MAG and the plate HOM for homogenizing a magnetic field, the formation of a gradient in a thin plate can be facilitated.

(10) The inclined plate INM made of materials with large permeability $\mu$ such as ferrite or the like is inserted between the magnet plate MAG and the shield case SHI. Thus, it is possible to bury a magnetic gap therebetween. Further, the plate INM can contribute to heat-dissipation. Since the plate INM employs the material with smaller retentiveness than that of the magnetic plate MAG, it is possible to keep an effective thickness of the permanent magnet as an uniform state.

(11) The shield case SHI is composed of magnetic materials with large permeability μ such as Permalloy or the like. Thus, it is possible to diminish magnetic resistance of the magnetic circuit having the magnet plate MAG as a magnetic field source. As a result, the thickness of the magnet plate MAG and the plane area thereof can be made smaller.

(12) The shield case SHI is composed of magnetic materials with large saturated flux density Bs. Thus, it has a function of bypassing a magnetic noise from the outside and preventing transmission of it to the chip CHI.

(13) The above-stated respects (11) and (12) brings to thinning the thickness of the shield case SHI.

(14) The shield case SHI employs as its material an iron-nickel alloy such as Permalloy. Thus it is suitable for bending operations and serves to protect the parts incorporated therein from mechanical extermal force.

(15) Since the magnetic circuit PFC for generating a revolving magnetic field and the bias coil BIC are formed as core types, the accomodating efficiency or the mounting density in the case RFS, SHI or PKG can be made higher.

(16) Since the case RFS is inserted between the core COR and the plate HOM for homogenizing a magnetic field, the interval therebetween can be minutely arranged by the thickness and the bending angle of the case for confining a revolving magnetic field RFS in addition to the thickness of the coil COI. As this interval is made shorter, the overall plane area can be made smaller. This can lead to lowering power consumption by means of reducing coil length. However, in case the interval is too short, the series bias magnet field Hb emitted from the magnet plate MAG is leaked to the core COR with high permeability. As a result, the uniformity of the bias magnetic field around the chip is deteriorated. Accordingly, this interval is very important to the above-stated characteristics. According to the present structure, it is possible to minutely arrange the interval.

(17) The drawn section is provided around the case RFS for confining a revolving magnetic field. Thus, it is easy to accomplish positioning of the magnet body BIM.

(18) The two inclined plates INN manufactured under the same manufacturing conditions with each other are disposed so as to have 180° of rotation angle difference between the upper and the lower surfaces on the plane. Thus, it is possible to position in almost parallel a pair of plates for homogenizing a magnetic field HOM and a pair of magnets MAG disposed upwardly of and downwardly of the chip.

Figure 3:
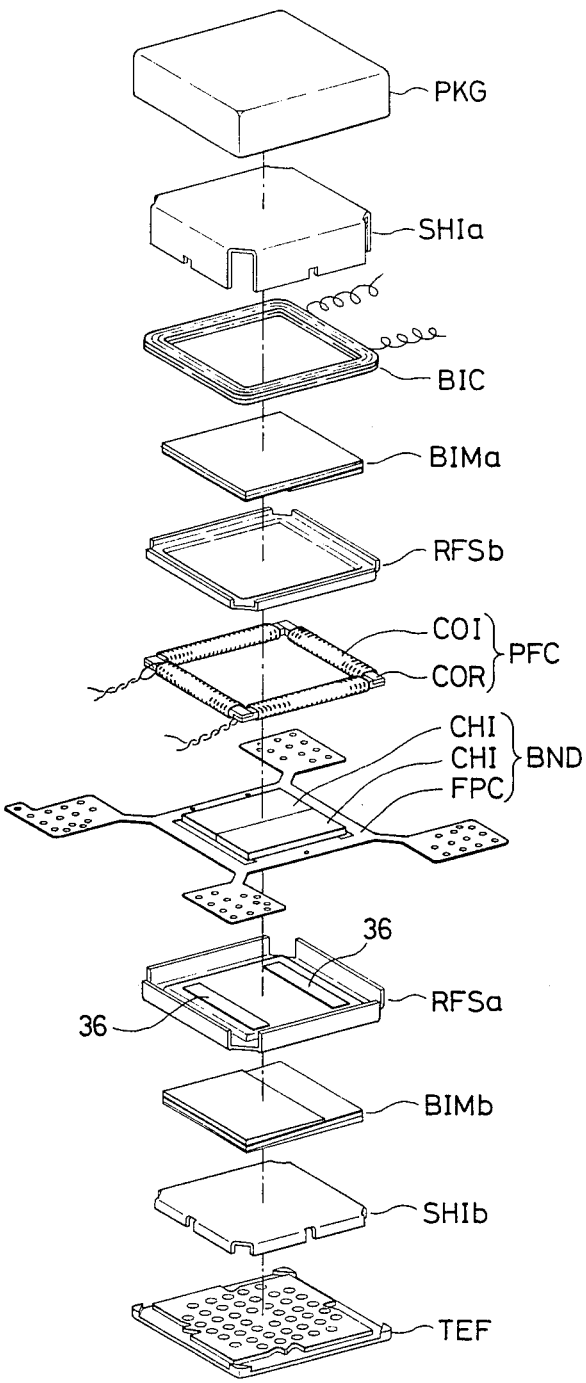
FIG. 3 is an exploded perspective view showing a laminating structure.

(Summary of assembling; FIG. 3)

FIG. 3 is a perspective view as to assembling for describing the order of pile-assembling respective components composing the above-stated magnetic bubble memory module. The same characters with the above-stated description show the same components. In this Figure, at first, the substrate assembly BND assembled by loading two chips CHI on the substrate FPC having connecting sections for input and output wirings projected at 4 corners and a chip-loading section at the control portion is disposed in an outer case RFSa on which insulating sheets 36 are disposed by attaching. Further, after the magnetic circuit PFC is incorporated in this substrate FPC, the substrate is filled with silicon resin STR (not shown). From the upper part, the inner case RFSb is engaged with the outer case RFSa and the side-contact portion between the outer case RFSa and the inner RFSb is electrically connected by means of soldering or the like.

Next, an upper magnet body BIMa and a lower magnet body BIMb are disposed on the concave drawn section provided on the outer surfaces of these outer case RFSa and inner case RFSb and then the bias coil BIC wound in order is disposed on the gap (not shown) formed by an outer edge section of this upper side magnet body BIMa and the inside of the inner case RFSb. These are accomodated in the outer shield case SHIa and further the inner shield case SHIb is incorporated therewith. Next, the side-contact portion between the outer shield case SHIa and the inner shield case is electrically connected.

Figure 4A:
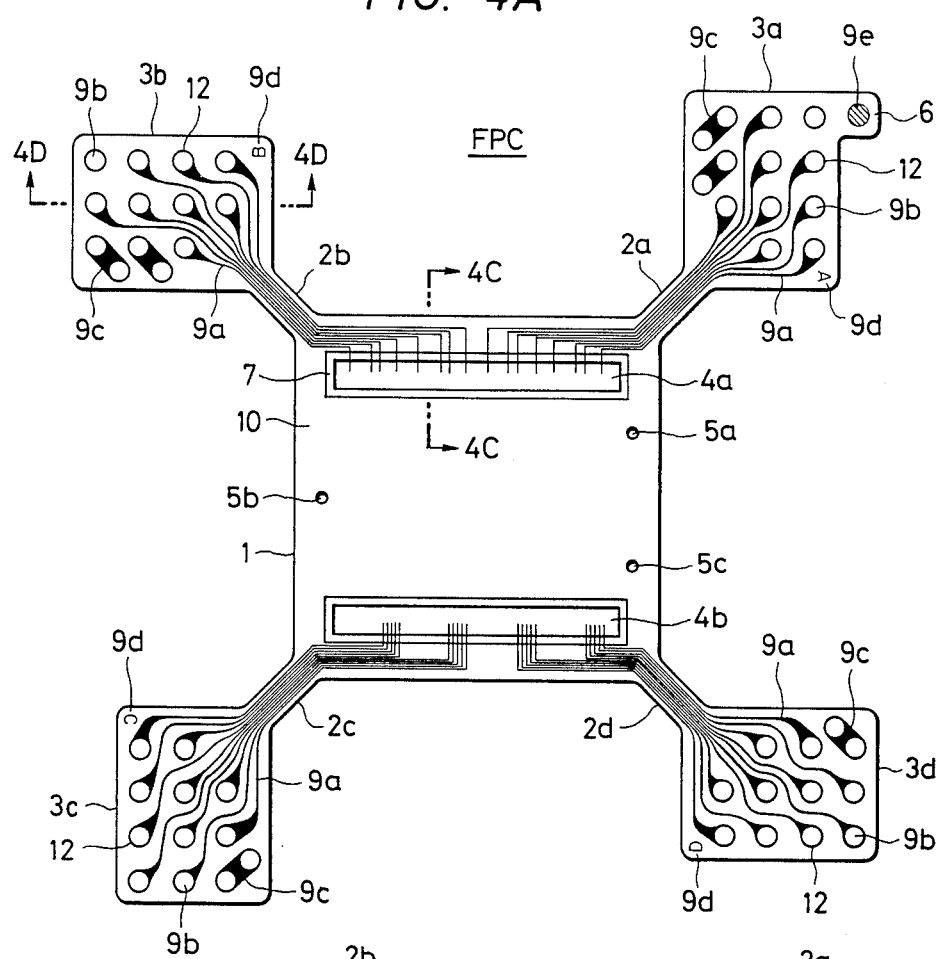
FIG. 4 includes FIGS. 4A–4D which are views of a substrate FPC.
Figure 4B:
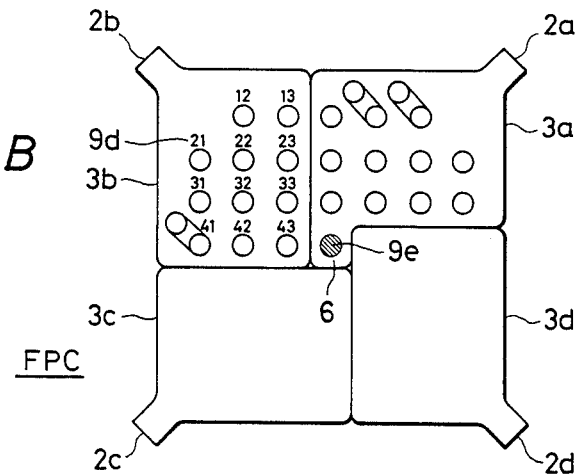

Then, the outer connection terminal-connecting sections of said substrate FPC projected at the four corners of the shield case SHI are bent to the rear surfaces of the inner shield case SHIa as shown in FIG. 4B and are incorporated so as to have a fixed form. A terminal-fixing plate TEF loaded with contact pads CNP at respective openings is disposed in contact with respective outer connection terminals covered by soldering or the like respectively provided at said terminal-connecting sections and respective outer connection terminals and the contact pads CNP are electrically connected with each other by means of soldering or the like.

Next, the assembly of them is accomodated in the packaging case PKG and the sealing such as hermetic sealing or the like is accomplished at the contact portions between the terminal-fixing plates TEF and the packaging case PKG so as to complete the assembling.

Next, the structure of the above-stated respective components are described.

(Flexible substrate; FIG. 4)

FIG. 4 shows the substrate FPC. FIG. 4A is a plan view showing it. FIG. 4B is a plan view showing the connecting sections of the outer connection terminals projected at 4 corners, which are bent to the assembly. FIG. 4C is an enlarged sectional view taken on the line 4C—4C in FIG. 4A. FIG. 4D is an enlarged sectional view taken on the line 4D—4D in FIG. 4A. In these drawings, the substrate FPC includes a rectangular chip-loading section 1 at the central part, sections to be bent 2 (2a, 2b, 2c, 2d) whose widths are small at the four corners and rectangular outer connection terminal-connecting sections (hereinafter, referred as to a connecting section) 3 (3a, 3b, 3c, 3d), which are integrally formed so as to wholly have an almost windmill-like form. Further, on the facing sides of this chip-loading section 1, there are provided double-frame structure of square openings 4 (4a, 4b) to be loaded with the two chips CHI stated after and to be connected with the terminal sections thereof and three holes 5 (5a, 5b, 5c) for positioning and there is provided a projection 6 for positioning at the tip of the connecting section 3C.

Figure 4C:
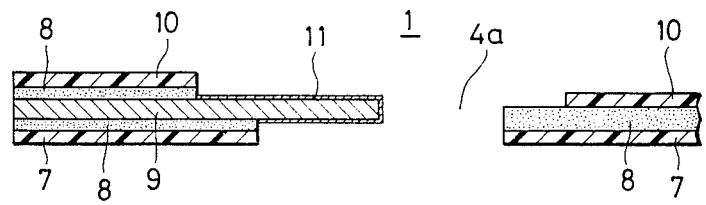

Further, in this substrate FPC, the patterns of lead wires 9a, circular outer terminals 9b, ellipsoidal coil lead-connecting terminals 9c, noted 9d, index marks 9e and the like as shown in FIG. 4A are formed by means of forming a copper thin film on a base film 7 made of a polyimide resin film with, for example, about 50 μm of thickness on which on epoxy system adhesive agent is coated as shown in FIG. 4C and then accomplishing etching of these films so as to form a required pattern. Further, a transparent or semi-transparent cover film 10 is attached and disposed on the upper surface of these films on which the adhesive agent 8 consisting of the same components with the above-stated agent is coated.

Figure 4D:
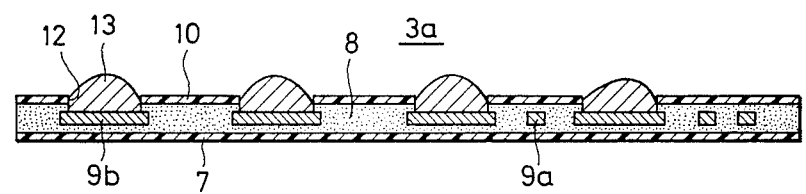

And, in the opening 4 of this substrate FPC, an opening is formed on the base film 7 to be a chip CHI-loading side not shown in the drawings to tightly restricted dimensional tolerance. Then, an opening in relatively large dimensions is formed on an upper surface side cover film 10. Further, the lead wires 9a are exposed between the base film 7 and the cover film 10 and on the surface of these lead wires 9a, there is formed a tinning layer 11. Consequently, the opening form has a two-layered structure and at once a double-frame structure. On the other hand, in the connecting section 3, as shown in FIG. 4D, circular openings 12 are formed on the portions corresponding with said circular outer terminals 9b of the cover film 10 and elliptical outer terminals 9c not shown in the drawings and a soldering layer 13 by plating, dipping or the like is formed on the copper thin film patterns of the outer terminals 9b and 9c exposed from the opening 12. And, respective outer terminals 9b and 9c provided at these connecting sections 3 are connected to respective lead wires 9a continuously formed on the chip-loading section 1, respective connecting sections 3a, 3b, 3c, 3d and respective bending sections 2a, 2b, 2c, 2d. These lead wires 9a are aggregated as respective blocks of respective connecting sections 3a, 3b, 3c, 3d at a part of respective opening edges of respective openings 4a, 4b and these tips of respective blocks are exposed in respective openings 4a, 4b. Namely, as shown in FIG. 4A, the lead wire 9a of the connecting section 3a is disposed at the left upper part of the opening 4a. The lead wire 9a of the connecting section 3b is disposed at the left lower part of the opening 4b. The lead wires 9a of the connecting section 3c are disposed at the right upper part of the opening 4a. The lead wires 9a of the connecting section 3d are disposed at the right lower part of the opening 4b.

And this substrate FPC is constructed so as to easily discriminate those patterns by looking through the cover film 10, because, in the step stated after, respective connecting sections 3a, 3b, 3c, 3d are combined for engagement, as shown in FIG. 4B by bending respective sections to be bent 2a, 2b, 2c, 2d and respective outer terminals 9b, 9c on which the soldering layer 13 is formed are exposed to the surface and further, the surfaces of the lead wires 9a, the note 9d and the index mark 9e are covered by the cover film 10.

Under this construction, the substrate FPC employs a polyimide resin film and is constructed to have a windmill-like form providing respective connecting sections 3a, 3b, 3c, 3d through respective sections to be bent 2a, 2b, 2c, 2d at the four corners of the chip-loading section 1. By constructing the outer terminal sections by bending and engaging these connecting sections 3a, 3b, 3c, 3d with one another, the chip-loading section 1 and the connecting sections are made to have two-layered wiring structures. Thus, without diminishing the area of the connecting sections 3, the area of the chip-loading section 1 is made larger and at once the outer terminal section can be made to have plural terminals. Accordingly, the overall form can be minimized.

Further, under the above-stated construction, it is possible to greatly shorten the lead wires 9a from respective outer terminals 9b to respective openings 4a, 4b of the chip-loading section 1. Thus, the influence caused by an external noise and the like can be greatly diminished. It means that it is possible to input and output a signal with a high S/N ratio. Further, by providing the projection 6 at one end of the connecting section 3c and at once the index mark 9e at this projection 6, this index mark can facilitate the discriminations for indicating the central part of the substrate in case of bending and engaging these connecting sections, positioning in case of combining the substrate with the cases RFS and SHI (refer to FIG. 2), distinguishing one of the lead wires 9a from another or indicating a production model or the like. Consequently, it is possible to rationalize assembling, controlling a substrate and the like. Further, by providing the openings 5a, 5b, 5c at both ends of the chip-loading section 1 of the substrate FPC, it is made to be easy to distinguish the right of the substrate FPC from the left thereof, position the chip CHI and the like and similarly it is possible to rationalize assembly efficiency.

Figure 5:
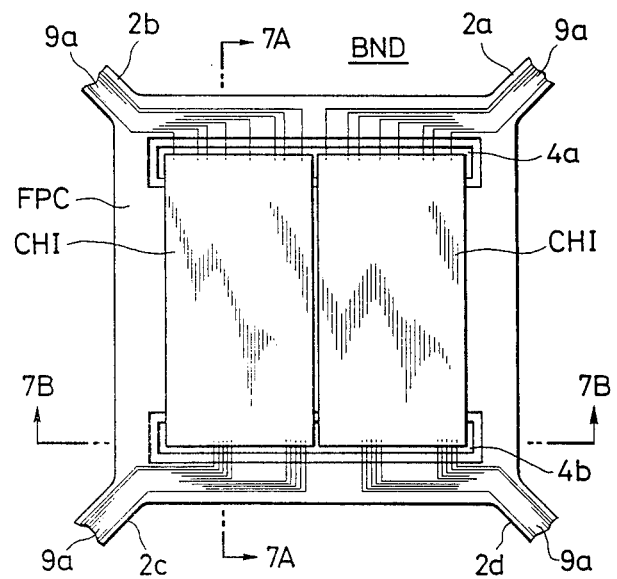
FIG. 5 is a plan view showing a substrate assembly BND where a chip CHI is loaded on the substrate FPC.
Figure 6:
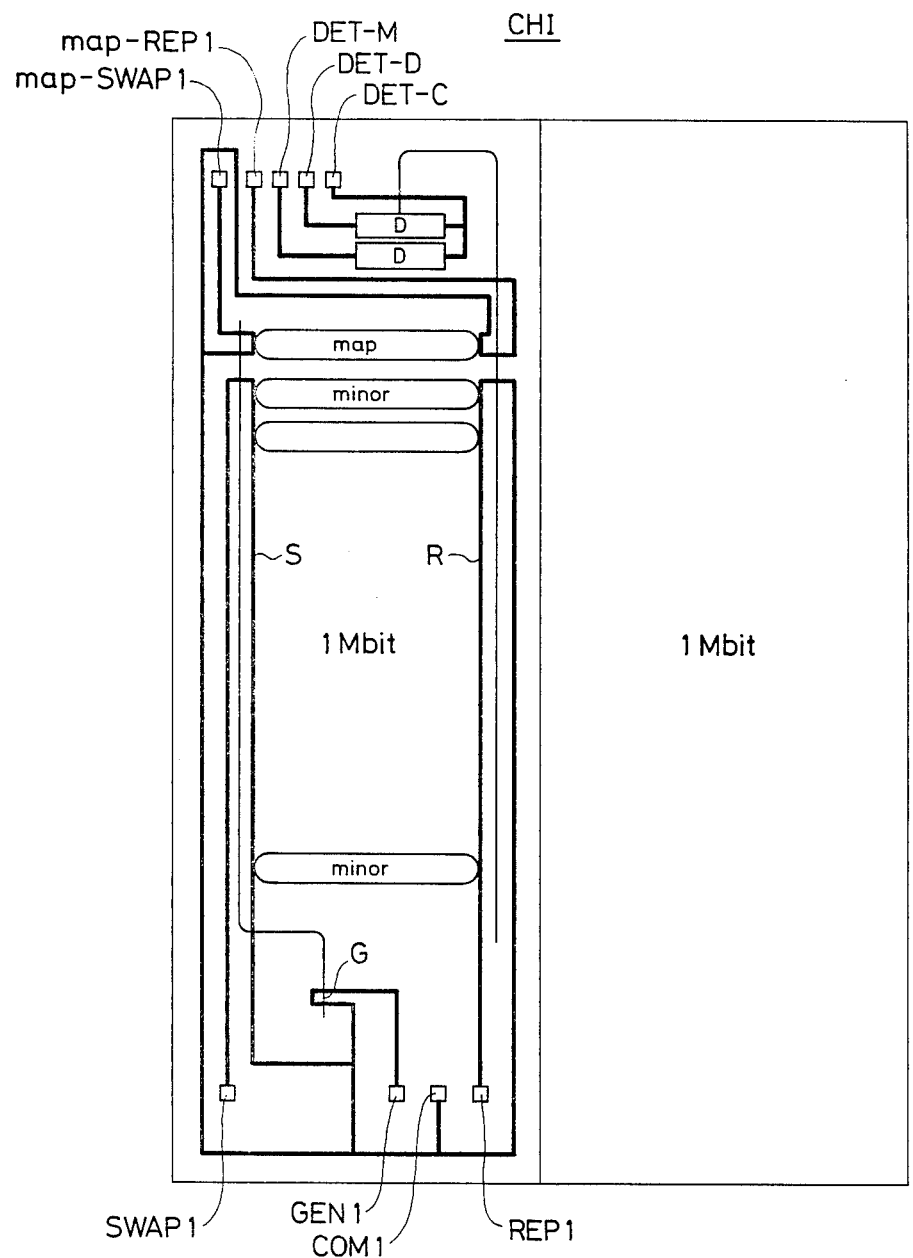
FIG. 6 shows a view showing the chip CHI.
Figure 7A:
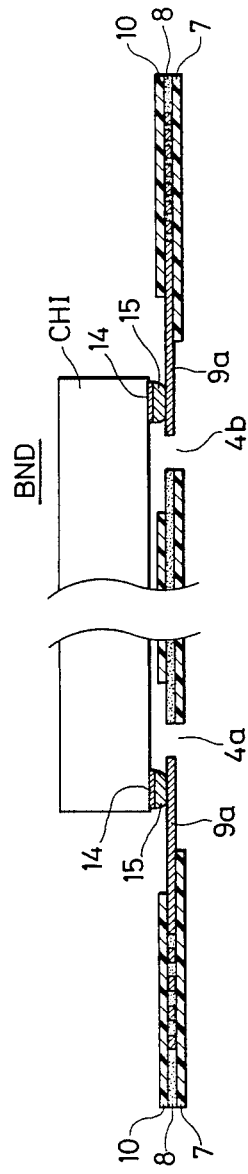
FIG. 7 includes FIGS. 7A and 7B which are views describing lead bonding of the substrate assembly BND.
Figure 7B:
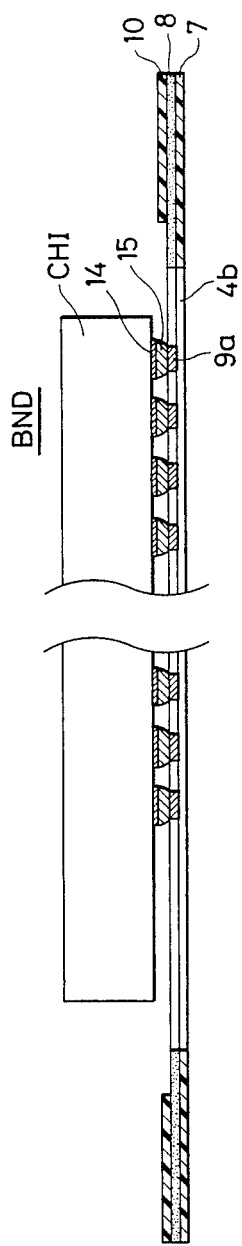

(Substrate assembly; FIGS. 5, 6 and 7)

FIG. 5 is a plan view showing the construction wherein the chip CHI is loaded on the above-stated substrate FPC. In this figure, two chips CHI are loaded on the chip-loading section 1 of the substrate FPC as disposing them between the openings 4a, 4b in parallel so as to complete the substrate assembly BND. One of the chips CHI is constructed by integrating two blocks of 1 Mbit as shown in an enlarged plan view of FIG. 6. Thus, two chips CHI have four blocks, that is, totally compose a 4M bits chip. Further, in one block of the chip CHI shown in FIG. 6, a large line shows a conductor pattern and a thin line shows a chevron pattern propagation path. The chip CHI xhown in FIG. 5 is loaded by means of the lead-bonding using Au-Sn eutectic crystal caused by a pressure welding method as disposing a gold bump 15 between respective bonding pads 14 provided by gold-plating at the end of the chip CHI and the wiring leads 9a on which the tinning layer 11 is formed in the opening 4 of the substrate FPC as respectively shown in enlarged sectional views of FIGS. 7A and 7B.

According to the above-stated construction, it is possible to fixedly support the chip CHI by connecting the lead wires 9a in the openings 4a, 4b of the substrate FPC with the bonding pads 14 of the chip CHI by means of the lead-bonding using Au-Sn eutectic crystal. Accordingly, it is possible to greatly ameliorate strength for connection and thin the construction. Further, the surface of the chip CHI is covered by the chip-loading section 1 of the substrate FPC. Thus, the surface of the chip CHI is protected and at once it is possible to ameliorate handling efficiency and to hold mechanical strength of the substrate FPC. Moreover, according to the above-stated construction, since each chip CHI consists of two blocks and two chips CHI are composed of 4 blocks, respective blocks can be distributively connected to respective connecting sections 3a, 3b, 3c, 3d which are the closest to respective blocks and thus the symmetric position of the chips CHI can be obtained so as to extremely facilitate a test, a check and the like. Further, since the substrate FPC provides four connecting sections 3a, 3b, 3c, 3d, it is possible to give and receive an input and an output signals having least noise by means of separating wirings for magnetic bubble detectors DET, map loops of each chip CHI and the like from the other wiring functions and aggregating them at one connecting section (refer to FIG. 6) and selectively disposing this connecting section at the location which is far away from a noise-generating source.

(Driving magnetic circuit; FIGS. 8 and 9)

Figure 8A:
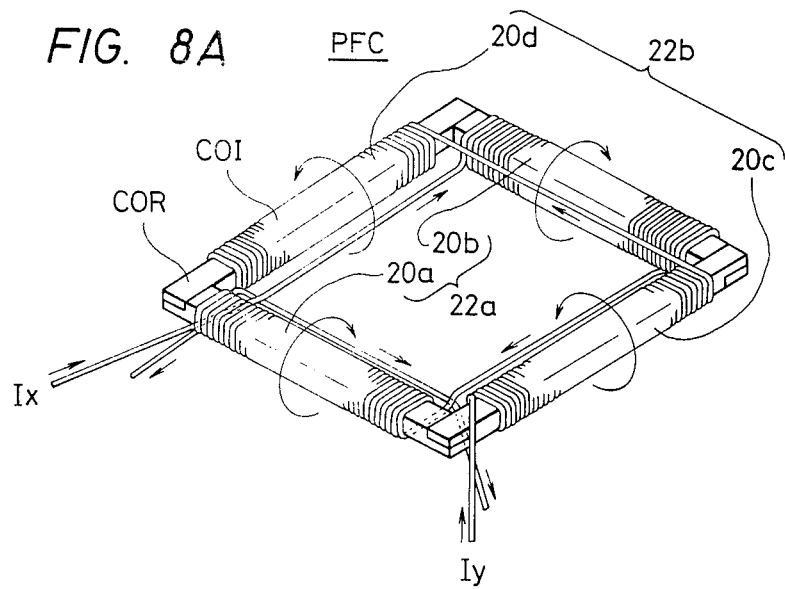
FIG. 8 includes FIGS. 8A and 8B which are views describing a magnetic circuit PFC.
Figure 8B:
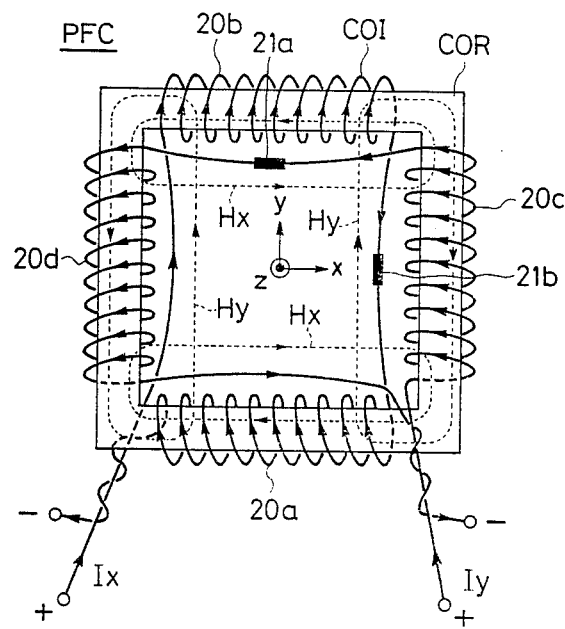
Figure 9:
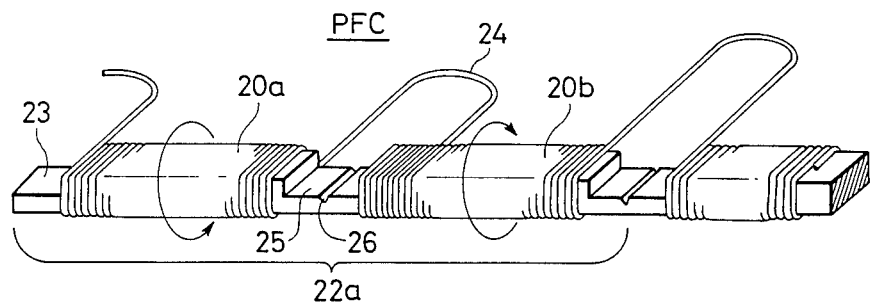
FIG. 9 is a view describing a producing method of the magnetic circuit PFC.

FIG. 8 shows the magnetic circuit PFC. FIG. 8A is a perspective view. FIG. 8B is a plan view showing the driving magnetic circuit. In these drawings, in the magnetic circuit PFC, a coil COI composed of four coils 20a, 20b, 20c and 20d by providing wirings (in the arrow direction are provided on the parallel sides facing to each other of the picture frame type of core COR made of soft magnetic materials and a X-coil 22a is composed by accomplishing series winding of the coils 20a and 20b on the sides facing to each other by way of a contact 21b and a Y-coil 22b is composed by accomplishing series winding of the coils 20c and 20b by way of a contact 21a. And, by supplying the X-coil 22b and the Y-coil 22b with currents Ix and Iy whose phase difference is 90° (for example, triangular wave current), as shown in FIG. 8B, leakage magnetic fields Hx and Hy are respectively generated in the x-axial direction and in the y-axial direction so as to supply the above-stated two chips CHI with them as a revolving magnetic field.

Further, the magnetic circuit PFC constructed as stated above is completed by the step of, as shown in a perspective view of FIG. 9, providing windings in a rectangular parallelepiped-like magnetic core 23 made of one soft magnetic material and a tap 24 at each plural blocks, forming a pair of coils, for example, a pair of X-coils 22a composed of the coils 20a, 20b, by accomplishing series winding and providing a wider groove 25 and a less wide groove 26 respectively having fixed widths between respective coils 20a and 20b by means of cutting work, afterwards, engaging the wider grooves 25 divided into two parts at the center of this less wide groove 26 with each other rectangularly and attaching them so as to buildup a picture frame type of core as shown in FIG. 8. Further, reversely, the rectangular parallelepiped core 23 forming the above-stated wider groove 25 and less wide groove 26 in advance can provide the coil 20a and the coil 20b by way of the tap 24 so as to form a pair of X-coils 22a. Moreover, the above-stated pair of Y-coils 22b can be formed quite similarly with the X-coils.

Under the construction stated above, since the rectangular parallelepiped core 23 provides the coils 20a, 20b as providing the tap in the series direction, in case of completing the construction by assembling as shown in FIG. 8, there is no need to connect lines (contact) as crossing them with each other and thus it is possible to simplify winding.

According to the construction stated above, since the X-coil 22a and the Y-coil 22b are made to be symmetric, coarse coupling is brought about. Thus, it is possible to ameliorate an inductance balance and to prevent magnetic interference among magnetic materials in relation to a leakage magmetic field. Moreover, this magnetic circuit PFC is made to have a picture frame type of structure and thus is not disposed on the upper or the lower surface of the chip CHI. Thus, the thickness in the lamination direction is made smaller and thus the thinning of the circuit can be realized.

(Case for confining a revolving magnetic field; FIGS. 10, 11 and 12)

Figure 10A:
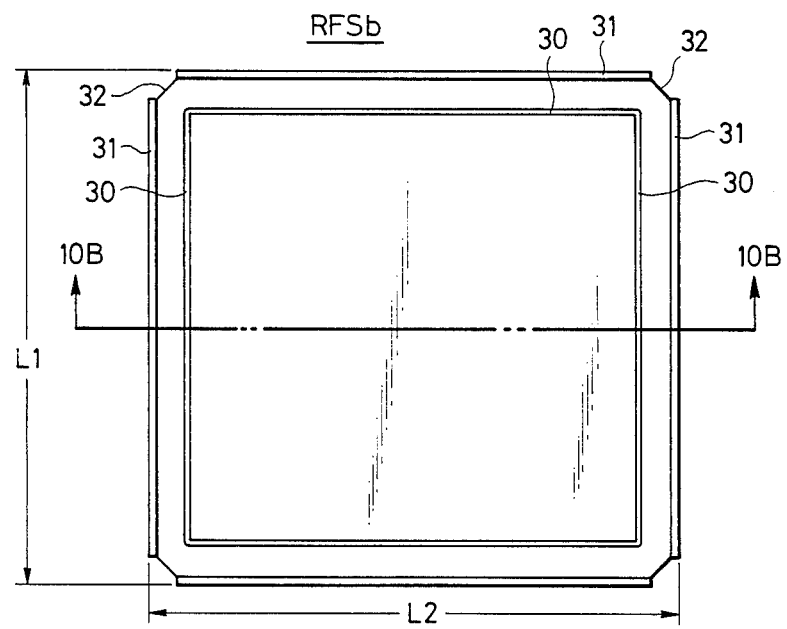
FIG. 10 includes FIGS. 10A and 10B which are views showing an inner case RFSb.
Figure 10B:
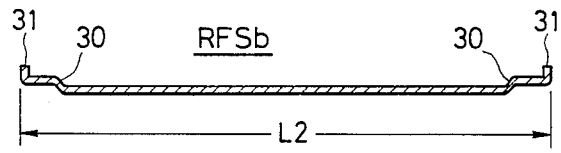

FIG. 10 shows the inner case RFSb. FIG. 10A is a plan view. FIG. 10B is a sectional view taken on the line 10B—10B of FIG. 10A. In the drawings, the inner case RFSb is built up of a frame type of drawn section 30 providing a concave portion at its center, bent sections 31 made by bending a pair of opposite side edges to each other upwardly about 90° and cut-away sections 32 made by cutting respective four corners in the slanting direction. This case RFSb is formed by press working of excellent conducting materials, for example, an oxygen free copper plate. In this case, the drawn section 30 and the bent sections 31 have a function of ameliorating mechanical strength of this inner case RFSb in the spiral direction and at once to suitably restrict outer length L in the vertical and transversial directions between each opposite bent sections 31 to each other. Further, the drawn section 30 can suitably arrange the distance between the magnet body BIMb disposed at the outer surface sides of this case RFSb and the chip CHI disposed at the inner surface side thereof. Besides, the cut-away sections 32 provided at the four corners form the drawing section of respective sections 2a, 2b, 2c, 2d to be bent of the substrate FPC disposed in this case RFSb.

According to the construction described above, it is possible to form the inner case RFSb by the press work. Thus, it can be manufactured in highly accurate dimensions and at low cost.

Further, for the inner case RFSb, oxygen free copper is employed but it is possible to employ copper, silver, or gold plate or the plate made by planting the alloy plate of these materials.

FIG. 11 shows the outer case RFSa corresponding with the above-stated inner case RFSb. FIG. 11A is a plan view. FIG. 11B is a sectional view taken on the line 11B—11B. In the drawings, this outer case RFSa is produced by using the same materials and manufacturing method with the above-stated inner case RFSb. It is comprised of a frame type of drawing section 33 providing a concave portion at its center, bent sections 34 made by bending two pairs of opposite side edges upwardly about 90° and cut-away sections 35 made by cutting away respective four corners in the slanting direction, similarly with the above-stated case. In this case, two pairs of bent sections 34 are formed to have the almost same inside length between the opposite bent sections with the outside length L between the corresponding opposite bent sections of said inner case RFSb and higher height H than those of said inner case RFSb. Moreover, these drawn section 33 and cut-away sections 35 are formed to have the almost same dimensions with those of said inner case RFSb.

The outer case RFSa and the inner case RFSb as constructed above are assembled to be an integrated case RFS by means of inserting the inner case RFSb into the outer case RFSa and connecting them with each other to make the inner case RFSb be in contact with the outer surfaces of the bent sections 31 of the outer case RFSa, as shown in FIG. 12A which is the plan view of the case RFS and in FIG. 12B which is the sectional view taken on the line 12B—12B of FIG. 12A.

Figure 13:
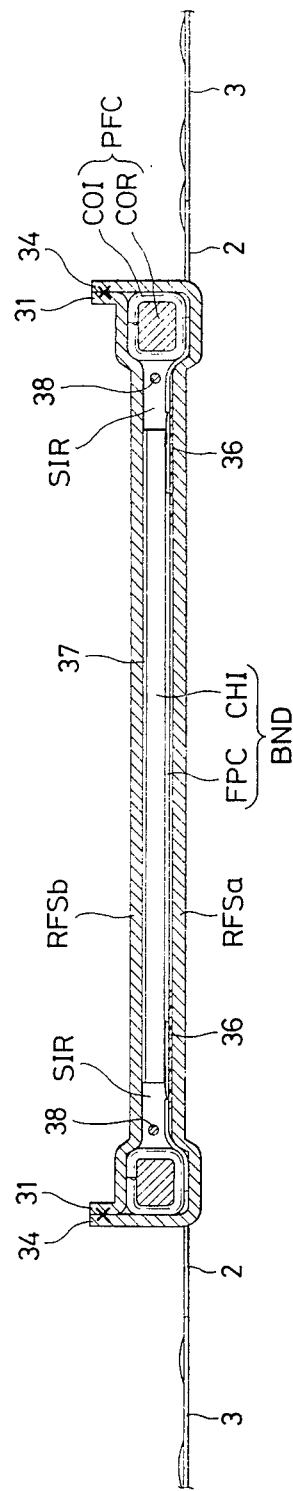
FIG. 13 is a sectional view showing an assembly case RFS in which the substrate assembly BND and the magnetic circuit PFC are accomodated.

(Case assembly; FIG. 13)

FIG. 13 is a sectional view showing the above-stated case RFS and the substrate assembly BND accomodated and disposed in said case. In this Figure, on the bottom of the outer case RFSa, for example, about 0.1 mm of thickness of polyimid film 36 is disposeed and attached as an electrically insulating sheet. The substrate assembly BND and the magnetic circuit PFC are respectively disposed on this film 36 and the peripheral portion thereof. Further, an epoxy system adhesive agent 37 is coated on the upper surface of the substrate assembly BND and then, in the upper part of them, the inner case RFSb is inserted, disposed and joined. In this instance, the inner surfaces of the bent sections 34 of this outer case RFSa are mechanically and electrically jointed with the outer surfaces of the bent sections 31 of the inner case RFSb at the portions marked by X by means of metal flowing, soldering or the like. Silicon resin SIR fills in the gap between this outer case RFSa and this inner case RFSb so as to fixedly dispose the substrate assembly BND and the magnetic circuit PFC. Further, in this case, the sections 2 (2a, 2b, 2c, 2d) to be bent of the substrate FPC are drawn from respective cut-away sections 32, 35 not shown provided at the four corners of these outer case RFSa and inner case RFSb to the outside. 38 denotes a lead wire for connecting coils COI with each other or connecting the coil COI with an external terminal 9c provided on the substrate FPC.

Under the construction described above, in case of generating a leakage magnetic field by means of driving the magnetic circuit PFC, induced current is flown through the case RFS so as to form a closed loop. This induced current serves to confine a revolving magnetic field in the case RFS and thus the uniform revolving magnetic field is supplied to the chip CHI.

According to this construction, the chip CHI loaded on the substrate FPC and the magnetic circuit PFC are respectively disposed so as to be caught in the central concave portion and in the peripheral convex portion between the outer case RFSa and the inner case RFSb. Thus, it is possible to ameliorate a packaging effect and assembling efficiency much. Moreover, since the volume covered by the outer case RFSa and the inner case RFSb is diminished, a VI product (α volume) can be reduced and thus it is possible to miniaturize the magnetic circuit PFC for generating a revolving magnetic circuit. Further, by reducing a gap between the opposite concave portions by means of providing concave portions formed by the drawn sections 30, 33 on the outer case RFSa and the inner case RFSb, in the revolving magnetic field, only the vertical component to the level of the chip CHI (Z component) are made close to zero and thus only the horizontal componemt is left. Accordingly, it is possible to ameliorate uniformity of the magnetic field. Then, since the magnetic circuit PFC and the case RFS have a symmetric structure in relation to a vertical axis to the element surface of the chip CHI, it is possible to ameliorate the uniformity thereof much more.

(Magnet body; FIG. 14)

FIG. 14 shows the magnet body BIM. FIG. 14A is a plan view thereof. FIG. 14B is a side view thereof. FIG. 14C is an elevational view thereof. In these drawings, the magnet body BIM is formed by piling up an inclined plate INN made of non-magnetic materials such as copper and having one predetermined inclined surface of the opposite surfaces, a plate HOM for homogenizing a magnetic field whose thickness is uniform and to be disposed at the inclined surface side of this inclined plate INN, a magnet plate MAG whose thickness is uniform and to be disposed at the upper surface side of this plate for homogenizing a magnetic field HOM and an inclined plate INM havong an inclined surface and to be disposed at the upper surface side of this magnet body MAG and then integrating them by means of an epoxy system adhesive agent. Thus, it is formed so sa to make the overall thickness of piling plates uniform. And, a uniform bias magnetic field can be radiated over the almost overall surfaces from the upper and the lower surfaces of this magnet body BIM.

(Bias coil; FIG. 15)

FIG. 15 shows a bias coil BIC. FIG. 15A is a perspective view thereof. FIG. 15B is a sectional view taken on the line 15B—15B of FIG. 15A. In the drawings, the bias coil BIC is formed to be a picture frame type having a predetermined value by means of providing windings in order 40 on which, for example, thermosetting resin is coated as an insulated member so as to be disposed as 5×4 windings in section and to make the overall form picture frame-like and then pressure-welding the windings by thermal deposition and cooling it. In this case, the bias coil is formed by thermal-depositing thermosetting resin coated on the outer surfaces of respective windings 40 and loading respective windings 40 and loading respective windings 40 by pressure-welding. Then, by cooling it, respective windings 40 are hardened in the united state of windings and thus having a predetermined picture frame.

Figure 16:
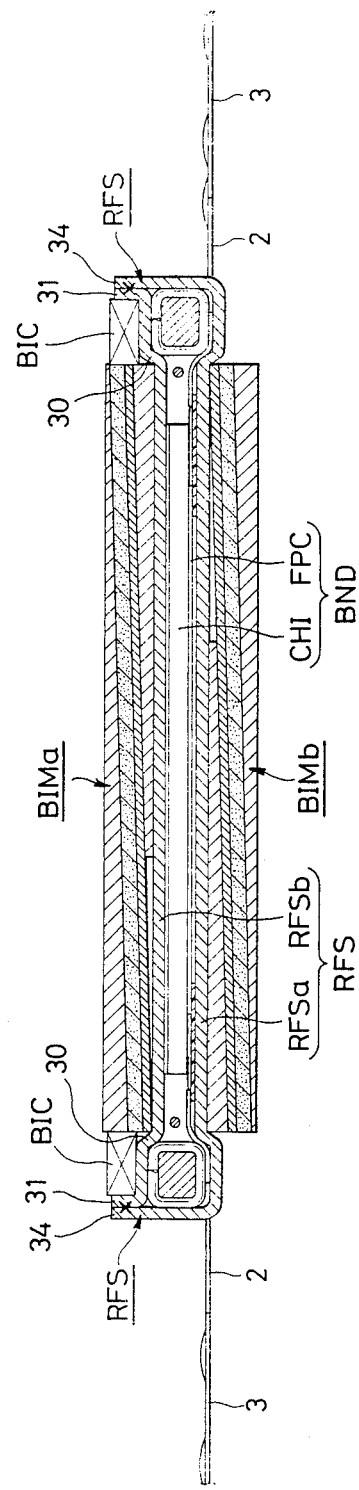
FIG. 16 is a sectional view showing an assembly of the case RFS with which a pair of magnets BIM and the bias coil BIC are incorporated.

(Mounting of the magnet body and the bias coil to the case assembly; FIG. 16)

FIG. 16 is a sectional view showing the case RFS desoribed in FIG. 13, the above-stated magnet body BIM and bias coil BIC incorporated in the case. In this Figure, an upper magnet body BIMa and a lower magnet body BINb are respectively disposed and jointed on the upper and the lower surfaces of the case RFS assembly accomodated in the substrate assembly BND and the magnetic circuit PFC. And, the bias coil BIC is accomodated and disposed in a picture frame groove section formed by being surrounded by the peripheral portion of this upper magnet body BIMa and the bent sections of the inner case RFSb. In this instance, the upper magnet body BIMa and the lower magnet body BIMb are formed by means of the same materials and in the same dimensions with each other. These magnet bodys BIMa and BIMb at their inclined plate INN sides are respectively disposed closely in a concave portion surrounded by the drawn section 30 of the inner case RFSb and a concave portion surrounded by the drawn section 33 of the outer case RFSa.

According to the construction described above, it is possible to dispose a pair of magnet bodies BIMa and BIMb in the concave portions formed at both surfaces of the central part of the case RFS assembly and further provide the bias coil BIC in the picture frame groove formed in the peripheral section of those magnet bodies. Thus, the overall thickness of each component in the laminating direction is made smaller and the miniaturizing and thinning of the construction can be realized. Further, since the picture frame space groove is formed by the outer case RFSa and the peripheral portion of the upper magnet body BIMb, it is possible to dispose the above-stated bias coil BIC in this space groove, to newly provide a bias coil and further to form a bias coil by accomplishing windings as using the groove as a coil bobbin.

(Magnetic shield case; FIG. 17, 18 and 19)

FIG. 17 shows an outer shield case SHIa. FIG. 17A is a plan view thereof. FIG. 17B is a sectional view taken on the line 17B—17B of FIG. 17A. In the drawings, the outer shield case SHIa is comprised of a flat section 51, bent sections 52 made by bending two pairs of opposite side edges of the flat section 51 upwardly about 90°, concave portion 53 made by cutting away part of the central parts of these bent sections 53 and cut-away sections 54 made by cutting respective four corners of these bent sections in the slanting direction. This outer shield case SHIa has high Permeability and saturated flux density and it should be preferably formed by press-working materials with high thermal conductivity, for example, a Permalloy plate.

FIG. 18 shows an inner shield case SHIb corresponding with the above-stated outer shield case SHIa. FIG. 18A is a plan view thereof. FIG. 18B is a sectional view taken on the line 18B—18B of FIG. 18A. In these drawings, this inner shield case SHIb is formed by the same materials and manufacturing method with the outer shield case SHIa stated above. It is comprised of, similarly with the above, a flat section 55, sections 56 made by bending two pairs of opposite side ends upwardly about 90°, concave portions 57 made by cutting away part of the central parts of these bent sections 56 and cut-away sections 58 made by cutting respective corners or these bent sections. In this instance, each opposite bent sections 56 have the almost same outside length between them with the inside length L4 between each opposite bent sections 52 of the above-stated outer shield case SHIa and the height H of the inner shield case SHIb is lower than that of the outer shield case SHIa.

Figure 19A:
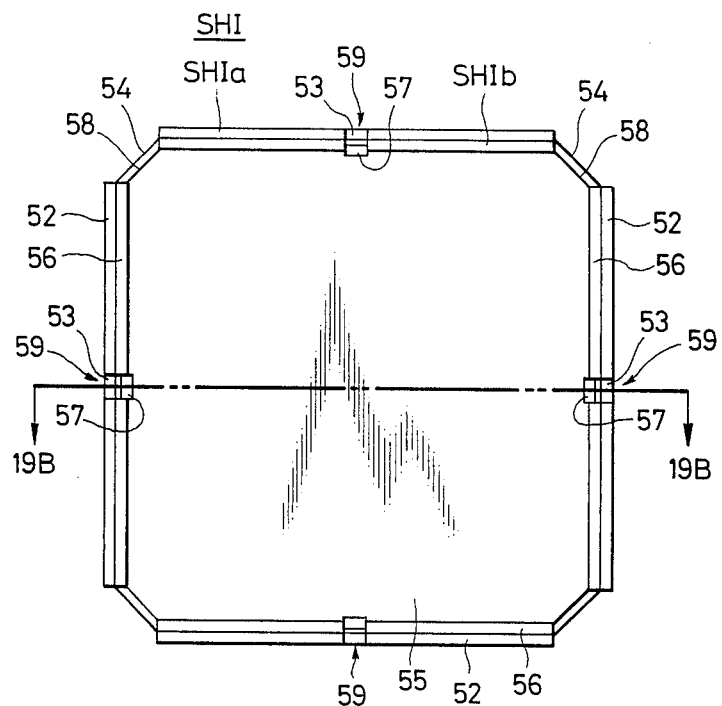
FIG. 19 includes FIGS. 19A and 19B showing an assembly drawing a shield case SHI.
Figure 19B:
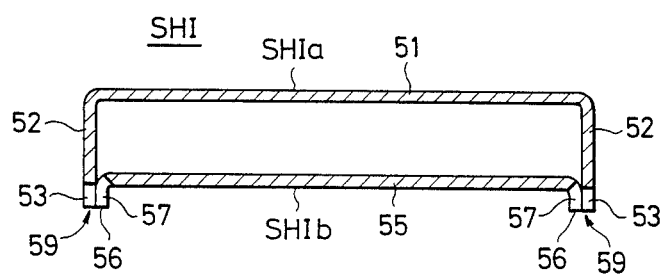

FIG. 19A is a plan view showing the outer shield case SHIa and the inner shield case SHIb constructed above. FIG. 19B is a sectional view taken on the line 19B—19B. The shield case SHI is integrally built up by means of inserting the inner shield case SHIb in the outer shield case SHIa and accomplishing spot-welding or solder-welding in relation to the concave portion 59 formed by the concave portion 53 of the outer shield case SHIa and the concave portion 57 of the inner shield case SHIa so as to magnetically and mechanically fix both shield cases with each other. In the construction described above, by arranging the bent sections 52 of the outer shield case SHIa and the bent sections 56 of the inner shield case SHIb in the lateral direction, that is, the direction crossed to the laminating direction but in the laminating direction, it is possible to make the dimensions in the lateral direction smaller and thus to miniaturize the construction and highly integrate components.

Figure 20:
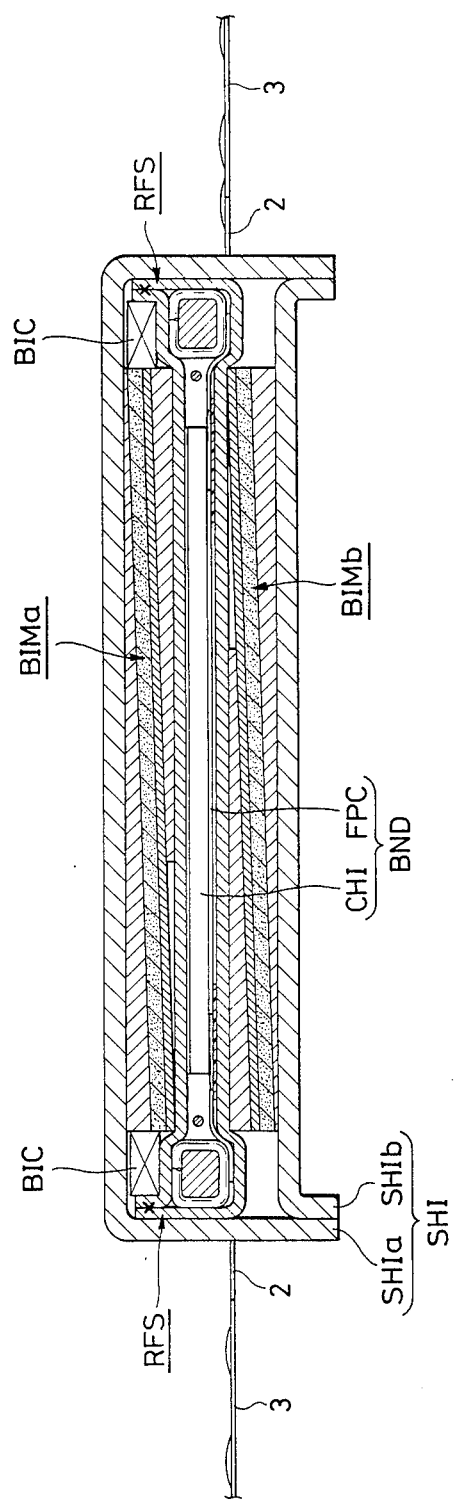
FIG. 20 is a sectional view showing the assembly shown in FIG. 16 incorporated in the shield case SHI.

(Magnetic shield case assembly, FIG. 20)

FIG. 20 is a sectional view showing the above-stated shield case SHI assembly, the case RFS assembly incorporating the substrate assembly BND and the magnetic circuit PFC therein as described in FIG. 16 and the assembly consisting of a pair of magnet body BIMa and BIMb and the bias coil BIC respectively incorporated in said shield case SHI assembly. In this Figure, in the inside of the outer shield case SHIa, the upper magnet body BIMa at the bottom to the center, the bias coil BIC at the peripheral portion, the case RFS assembly (incorporating the substrate assembly BND, the magnetic circuit PFC and the like therein), the lower magnet body BIMb are sequentially laminated and disposed and then the inner shield case SHIb is inserted to the outer shield case. Both shield cases are sealed with each other by means of welding the concave portion 59 (refer to FIG. 19) formed by the concave portion 53 of the outer shield case SHIa and the concave portion 59 of the inner shield case SHIb stated above. In this case, if grease or the like is made to fill in this shield case SHI, the components staying therein are substantially and closely attached with one another and the heat generated in this case RFS can be dissipated to the outside through this shield case SHI. Further, it is possible to ameliorate a dissipating effect by employing the structure wherein the case RFS and the shield case SHI are in contact with each other by means of a press fitting system.

Under the construction stated above, by laminating in order the case RFS assembly on the bottom of the outer shield case SHIa as confronting these bent sections 31, 34 with each other, respective components laminated between the outer shield case SHIa and the inner shield case SHIb are closely disposed. Thus, it is possible to miniaturize and thin the shield case and at once to obtain a dissipating effect.

(Packaging case; FIG. 21)

Figure 21A:
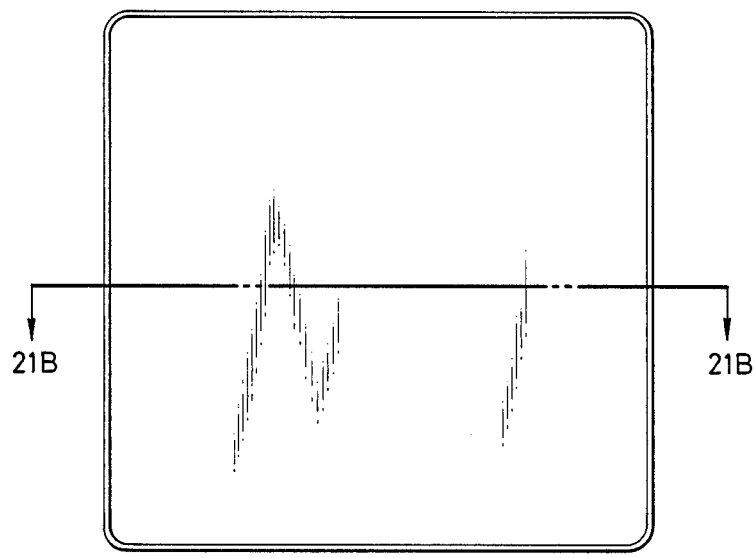
FIG. 21 includes FIGS. 21A and 21B which are views showing a packaging case PKG.
Figure 21B:
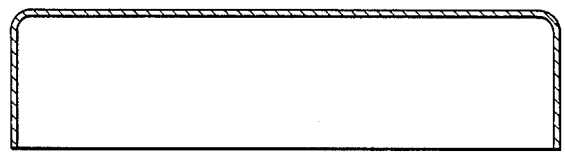

FIG. 21 shows a packaging case PKG. FIG. 21A is a plan view thereof. FIG. 21B is a sectional view taken on the line 21B—21B. In the drawings, the packaging case PKG can be formed by means of accomplishing the drawing to the materials with excellent thermal conductivity, for example, an aluminum plate whose thickness is about 0.5 mm. And, a black coat (not shown) is provided on the outer surface of the case. It is possible to utilize the above-stated outer shield case SHIa as a packaging case PKG by improving the form of said outer shield case.

Under the construction, this packaging case PKG serves as an outer case given after completion of a magnetic bubble memory module and has a function as a dissipating member. Besides, the inside corner sections thereof has a function as a mold in case of resin molding by means of a potting method stated after.

(Terminal-fixing plate and Contact pad; FIGS. 22 and 23)

Figure 22C:
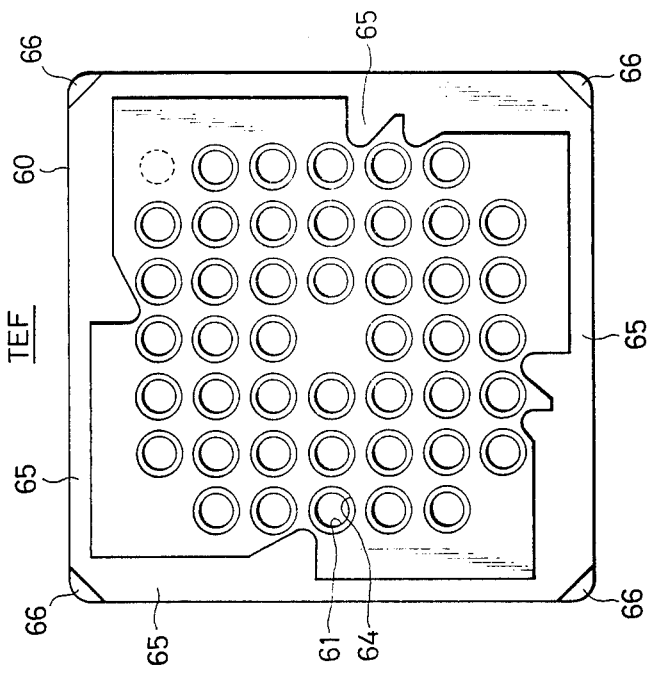
FIG. 22 includes FIGS. 22A–22C which are views describing the construction of a terminal-fixing plate TEF.
Figure 22A:
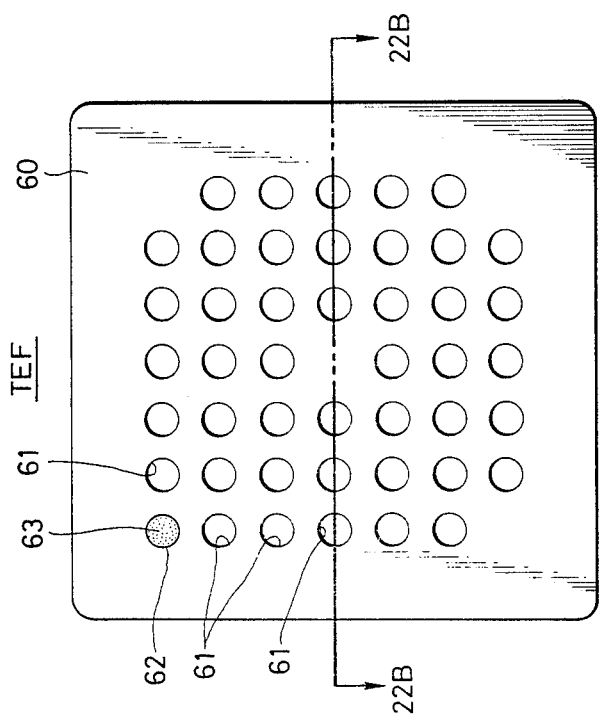
Figure 22B:
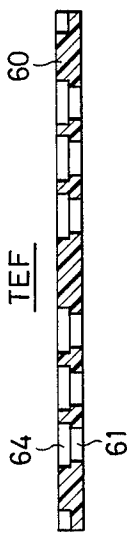

FIG. 22 shows a terminal-fixing plate TEF. FIG. 22A is a plan view thereof. FIG. 22B is a sectional view taken on the line 22B—22B. FIG. 22C is a rear elevation thereof. In the drawings, the terminal-fixing plate TEF is made of electrically insulating mateirqls, for as a glass epoxy system resin plate 60 and is formed to have such length and breadth as to freely put in or out of said packaging case PKG. And, on the surface of this resin plate 60 except its peripheral portion, a plurality of through holes 61 are provided in matrix arrangement with a predetermined interval in the breadth and length direction. At the corner portion of the through hole block, a non-through hole 62 which is rotationally symmetric and has a concave in section is provided. There is attached a mark 63 such as a white coat for indicating direction or distinction in this non-through hole 62. Further, a plurality of through holes 61 provided in this resin plate 60 provide openings 64 with a large diameter axially connected with through holes at the rear side of the resin plate as shown in FIG. 22B. These openings 64 all have depth of about 60% of the plate thickness and are respectively connected with the through holes 61 as having steps on the way of connection. Further, at the rear side of this resin plate 60, there is formed along the peripheral portion a groove 65 which has the almost same depth with the depth of said openings, different width in the horizontal direction therefrom and a concave state in section. The inside of this groove 65 serves as the passage section and the connection section of the coil COI windings and the bias coil BIC windings stated above, Further, the corner portions of this resin plate 60 are not formed as concave forms. They have a predetermined plate thickness and serve as contact surfaces to the inner side surfaces of the above-stated packaging case PKG. As stated above, the rear side of the resin plate 60 is formed to have a two-stepped structure which, namely, has two thicknesses.

Figure 23A:
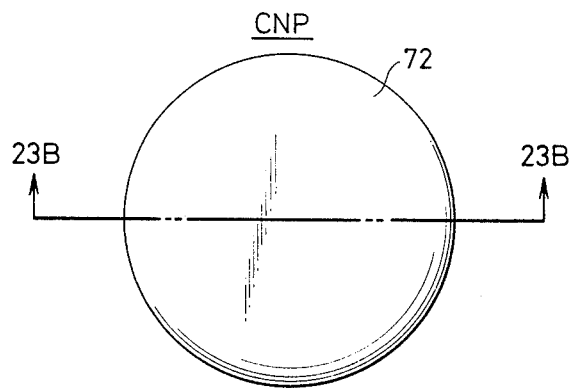
FIG. 23 includes FIGS. 23A and 23B which are views showing the construction of a contact pad CNP.
Figure 23B:
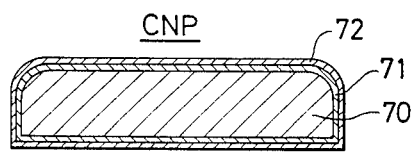

FIG. 23 shows a contact pad CNP. FIG. 23A is a plan view thereof. FIG. 23B is a sectional view thereof. In these drawings, the contact pad CNP is formed by means of accomplishing pressing work of good conducting materials, for example, a copper plate whose thickness is about 0.5 mm to punch out a piece member 70 and then forming a nickel-planting layer 71 and a gold-planting layer 72 on the surface of the piece member 70.

(Final assembly; FIGS. 20, 4 and 2)

Of respective components constructed as described above, at first, the shield case assembly described in FIG. 20 is inserted to the packaging case PKG stated above. Under this state, respective connecting sections 3a, 3b, 3c, 3d of said substrate assembly BND (refer to FIG. 4A) are projected from the four corners of this packaging case PKG as bent at about 90 degrees on the basis of respective sections to be bent 2a, 2b, 2c, 2d. Next, respective components are fixedly disposed in this packaging case PKG by accomplishing a resin-molding to the four corners of this packaging case PKG by means of a potting method. And, these connecting sections 3a, 3b, 3c, 3d are respectively bent about 90 degrees by the corresponding sections to be bent 2a, 2b, 2c, 2b and then are engaged on the outer surface of the inner shield case SHIb shrough an adhesive agent as shown in FIG. 4B. Then, the contact pads CNP are loaded in respective openings provided on the rear side of said terminal-fixing plate TEF or the sides of the contact pad CNP are made solid by means of an adhesive agent and then the treated contact pads CNP are inserted in the packaging case PKG so as to be disposed in contact with respective connecting sections 3a, 3b, 3c, 3d. In this instance, the arrangement pitch of respective external terminals 9b provided on respective connecting sections 3a, 3b, 3c, 3d corresponds with the arrangement pitch for respective contact pads CNP. Thus, respective external terminals 9b are electrically in contact with the contact pads CNP. Next, a heated thing whose tip is slender or something like that is inserted to each through holes 61 from the rear side of the disposed terminal-fixing plate TEF so as to attach the contact pads CNP with the external terminals by pressure welding. Consequently, respective external terminals 9b are electricaly connected with the corresponding contact pads CNP and at once the terminal-fixing plate TEF is mechanically fixed to the contact pads so as to complete the magnetic bubble memory module as shown in FIG. 2.

(Magnetic bubblememory chip; 24, 25, 26, 27 and 28)

Figure 24:
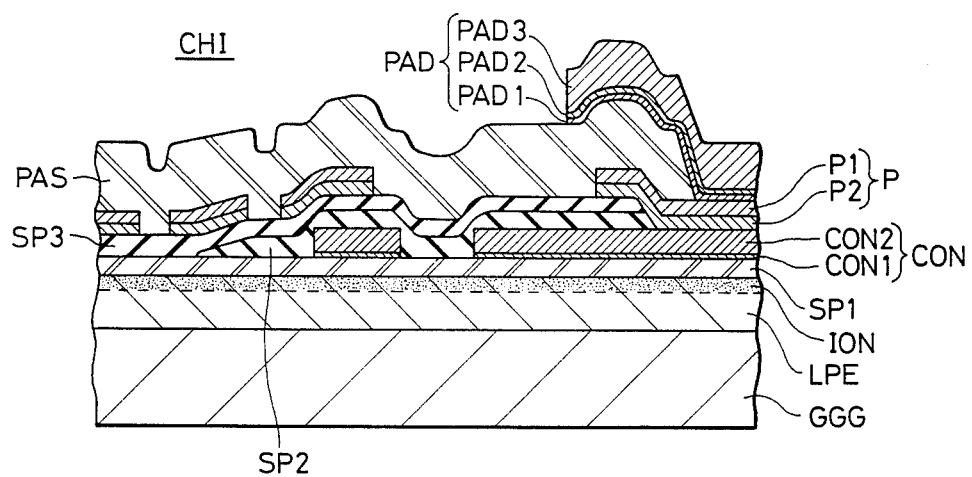
FIG. 24 is a sectional view showing the chip CHI.

FIG. 24 is a sectional view showing the portion around the bonding pad PAD of the magnetic bubble chip CHI stated above. In this Figure, GGG (gadolinium-gallium-garnet) denotes a substrate. LPE denotes a bubble magnetic film formed by means of a liquid phase epitaxial growth method. One example of its composite is referred in the following Table 1.

TABLE 1

| | Item | Characteristic |
|---|---|---|
| bubble film | composite | $(YSmLuC)_3(FeGe)_5O_{12}$ |
| | film thickness | 1.75 $\mu$m |
| | magnetic bubble diameter | 1.75 $\mu$m |
| | extinction magnetic field | 280 Oe |
| | saturated flux density | 480 Gauss |
| | bit period | 7.0 $\mu$m |
| chip | spacer thickness | 0.3 $\mu$m |
| | transfer pattern-forming method | RF sputtering method |
| | Fe—Si film thickness | 2500Å |
| | Permalloy film thickness | 1500Å |
| | transfer pattern dimensions | minimal line with 1.0 $\mu$m minimal gap 1.0 $\mu$m |

INO denotes an ion-implanted layer formed on a LPE film surface for restraining hard bubbles. SP1 denotes a first spacer which serves to form, for example, $SiO_2$ whose thickness is 3000 Å by means of a gaseous phase chemical reaction. CON 1 and CON 2 denote two conducting layers and has a function of controlling generation of bubbles, duplication (division) thereof and exchanging thereof as stated above. A lower first conducting layer CON 1 and an upper second conducting layer CON 2 are respectively made of materials such as Mo and those such as Au. SP2 and SP3 respectively denote layer-insulating films (a second and a third spacers) made of polyimide resin or the like for performing electrical insulation between the conducting layers CON and a transfer pattern layer P made of Permalloy or the like formed thereon. PAS denotes a passivation film formed out of a $Sio_2$-film or the like formed by means of a gaseous phase reaction method. PAD denotes a bonding pad of the chip CHI, where a fine connector wire such as a Al-wire or the like is bonded by means of a pressure welding method or a supersonic method. In this bonding pad PAD, a lower first layer PAD 1, a middle second layer PAD 2 and an upper third layer PAD 3 are respectively formed out of materials such as Cr, those such as Au and those such as an Au-plating layer. It is possible to form the second and the third layers PAD 2 and PAD 3 out of the materials such as Cr, Cu or the like. P denotes the layer utilized as a transfer path of bubbles, a dividing, a generating, exchanging and searching sections of bubbles and a guardrail section. In the description stated after, it is described as a transfer pattern layer for convenience' sake.

As an example shown in FIG. 24, this tranfer pattern layer P employs Fe-Ni as a lower layer P1 and an upper layer P2, but it is possible to exchange both materials with each other as stated before.

Figure 25:
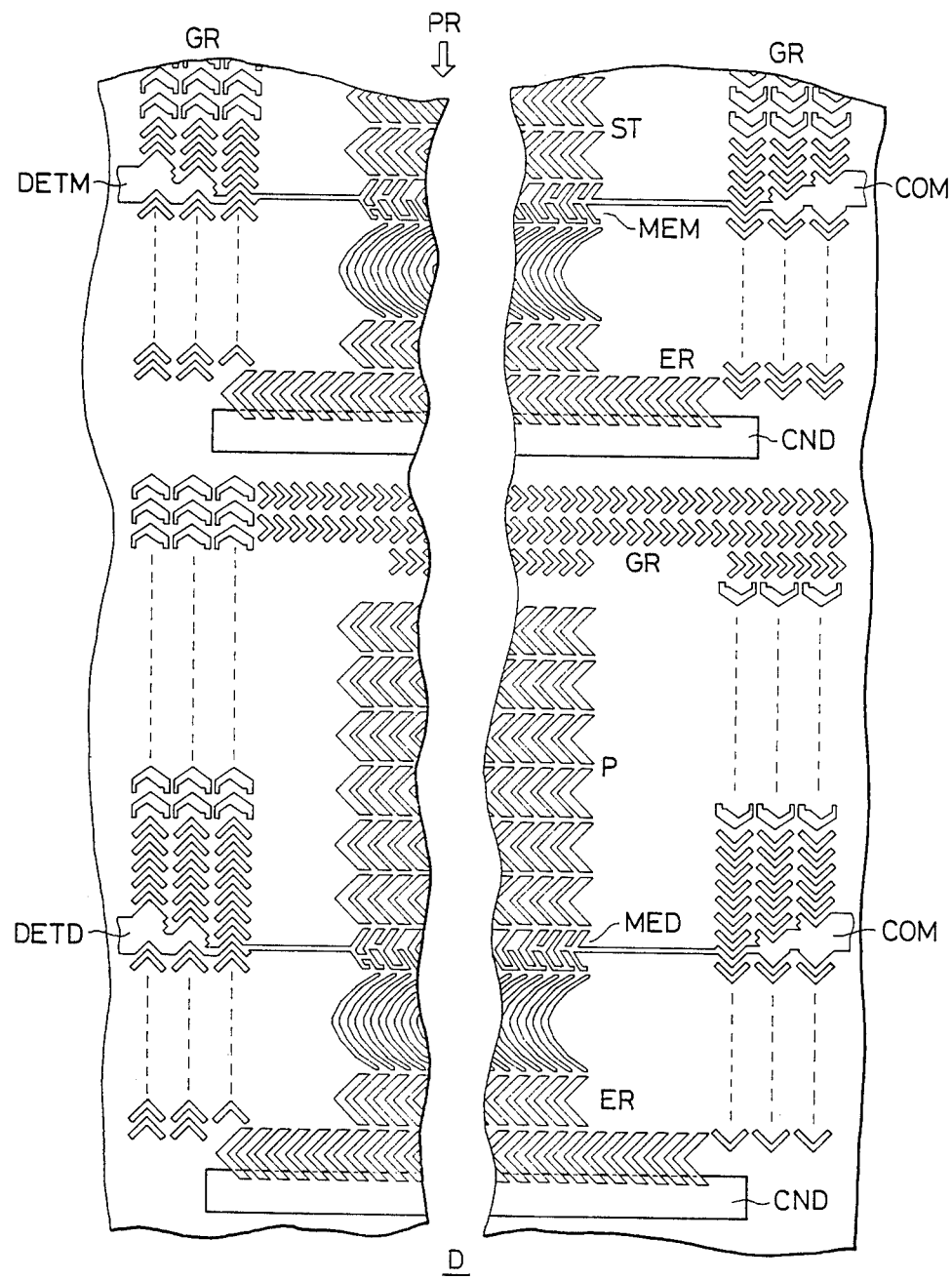
FIG. 25 is a view showing the construction of a magnetic bubble detector D of the chip CHI.

Hereinafter, the example in which a multi-layered transfer pattern layer is applied for respective sections of the chip CHI with referenoe to the plan views of FIG. 25 and the drawings thereafter. In these plan views, each layer of the transfer pattern layer 18 formed by a self alignment and thus attention should be payed to the layers expressed by the same contour therewith. FIG. 25 shows a D section of a bubble detector. MEM denotes a main magnetic resistance element for detecting the existence of bubbles by means of variation of a resistance value provided in case of passing the bubbles extended like a band in the lateral direction through the element. MED denotes a dummy magnetic resistance element having the same pattern form with those of the main magnetic resistance element and is utilized for detecting noise components brought about by the influence of a revolving magnetic field and the like. At the upper side of the main magnetic resistance element MEM, there are formed scores of steps of bubble stretchers ST for transferring the bubbles downwardly as stretched in the lateral direction though only the two steps thereof are shown in the drawing. Further, PR denotes the transfer direction of bubbles. ER denotes a bubble eraser and serves to erase bubbles when they attain to the conducting layer CND. The guardrail GR consisting of pattern blocks lining up in three files is provided around this detector D and between the dummy and the main detections and serves to get the unnecessary bubbles generated in the inside of the guardrail GR out of the guardrail and to prevent entering the unnecessary bubbles generated in the outside of the guardrail GR into the inside thereof. Further, in the plan pattern views after FIG. 25, the patterns except the conducting layer CND pattern show the transfer pattern layer P described in FIG. 24. In FIG. 25, a signal-to-noise ratio (S/N ratio) is ameliorated by means of forming the magnetic resistance elements MEM and MED by a multilayered magnetic layer. For example, in case of utilizing a three-layered Permalloy layer laying a $SiO_2$-film as a transfer pattern between respective layers, it is possible to ameliorate a S/N ratio over doubly in comparison with the case of using a Permalloy single layer as shown in the following Table 2.

TABLE 2

|  | Single output S | Noise component | S/N ratio |
|---|---|---|---|
| single layer | 8 (mV) | 1.1 (mV) | 7.3 |
| three layers | 12 (mV) | 0.7 (mV) | 17 |

Further, the efficiency of the guardrail GR can be improved because of heightening a discharging factor for unnecessary bubbles by means of reducing retentiveness Hc.

Figure 26:
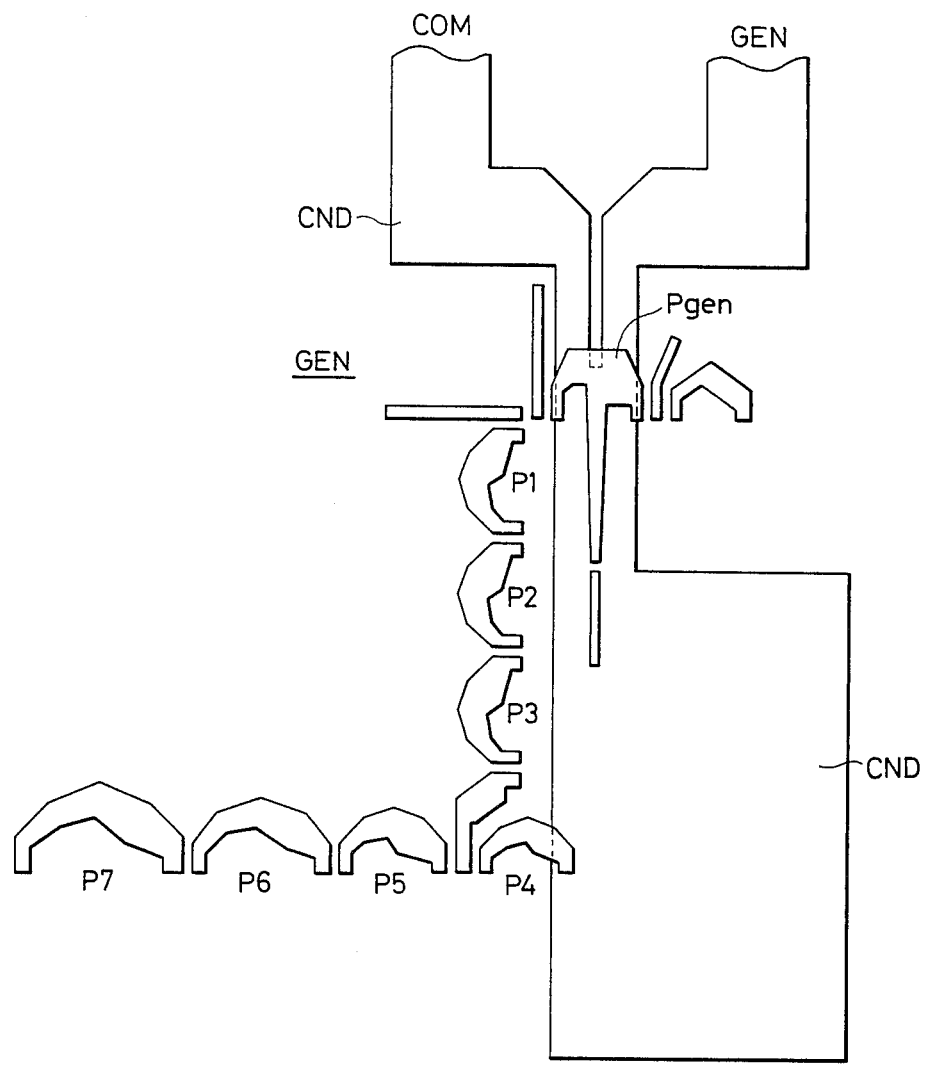
FIG. 26 is a view showing the construction of a magnetic bubble generator GEN of the chip CHI.

FIG. 26 shows a magnetic bubble-generator GEN. The current generated in the magnetic bubbles can be made smaller by making the transfer pattern layer P multilayered and thus it is made possible to lengthen the life of the conducting layer CND of the magnetic bubble-generator. Accordingly, the driving circuit for the conducting layer CND can employ a semiconductor element with a small current capacity value and thus its cost can be made lower.

Figure 27:
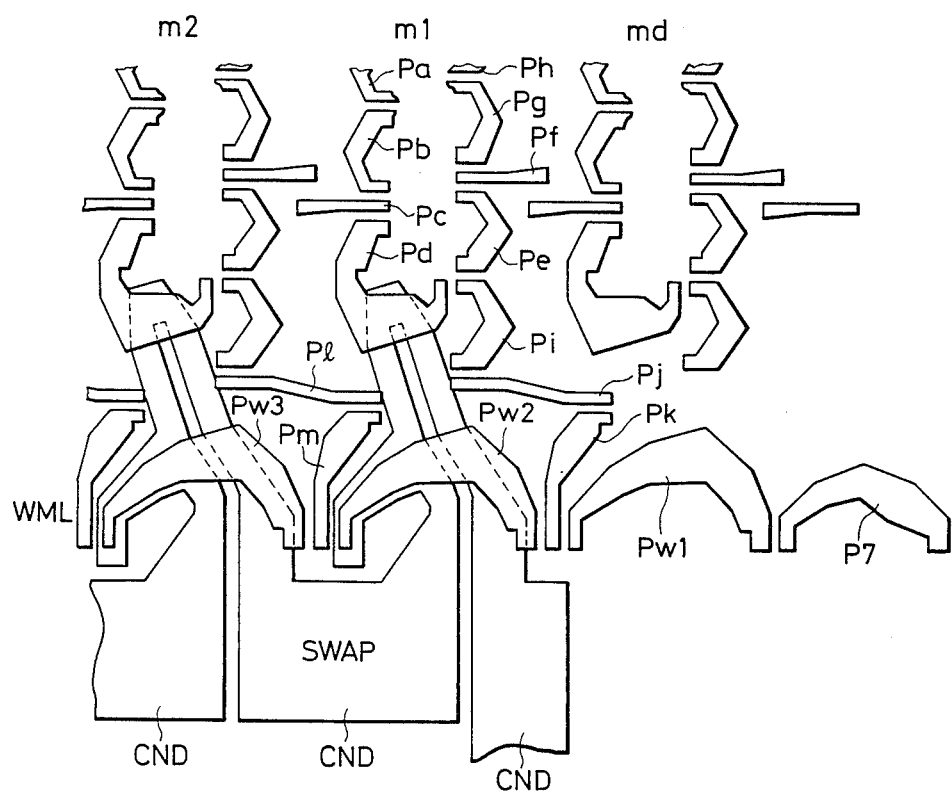
FIG. 27 is a view showing the construction of a swap gate SWP of the chip CHI.

FIG. 27 shows a minor loop m composed of transfer patterns such as Pa-Ph and the like, a write major line WML composed of the transfer patterns such as $Pw_1$ to $Pw_3$ and the like and a swap gate section composed of a hairpin conducting layer CND. In this Figure, P7 is the same with the transfer pattern P7 in the bubble-generator GEN shown in FIG. 26. In other words, the bubbles generated in the bubble-generator GEN are transferred to the write major line WML through the P1 to P7 transfer paths. When the swap conducting layer CND is energized, the magnetic bubbles in the transfer pattern Pd of the minor loops ml are transferred through the transfer patterns Pl and Pm to the transfer pattern Pw3 of the major line WML and the magnetic bubbles from the major line PW1 are transferred through the transfer patterns Pk, Pj and Pi to the transfer pattern Pe of the minor loop in order to accomplish an exchange of bubbles, that is, informations with each other. Further, the swap gate is not provided in the minor loop md at the right end, because it is a dummy loop where magnetic bubbles are not injected for reducing a peripheral effect. As described above, it is possible to accomplish an exchange of magnetic bubbles with a small current value by means of making the transfer pattern layers Pi to Pm at the exchange location multilayered.

Figure 28:
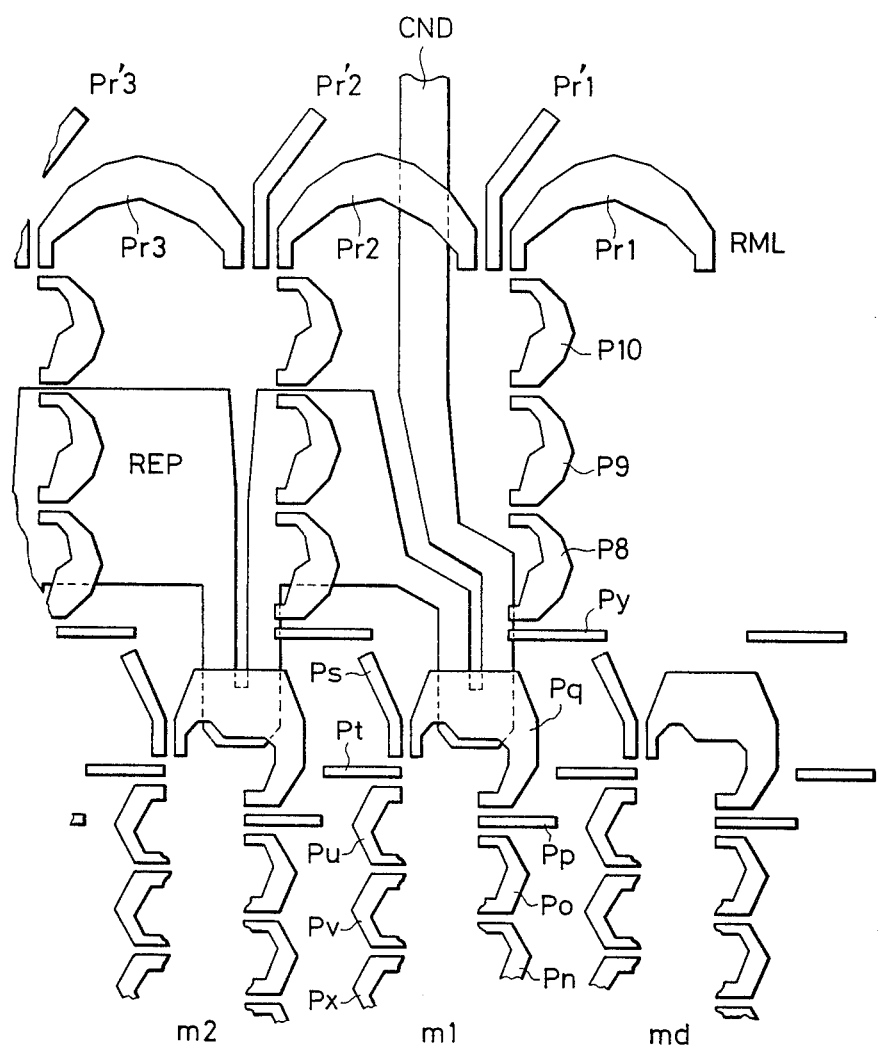
FIG. 28 is a view showing the construction of a replicate gate REF of the chip CHI.

Moreover, as shown in FIG. 28, similarly with the above, it is possible to accomplish the drive with a small current value by means of a replicator for magnetic bubbles, that is, a divider therefor. In this Figure, the magnetic bubbles are usually transferred on the route of Pn to Pg and Ps to Px. When the conducting layer CND is energized, the bubbles is divided at the location of the transfer pattern Pg and one divided magnetic bubble is transferred to a read major line RML by way of Py and P8 to P10.

(Holding magnetic field and Revolving magneticfield, FIG. 29)

The magnetic body MAG is disposed as about 2 degrees tilted in relation to the chip CHI. This is designed to apply a bias magnetic field Hb to the chip CHI in the direction a little shifted from the vertical. Thus, it is possible to generate a holding magnetic field Hdc for ameliorating start and stop margins of the bubble transfer to raise about 6(Oe) (FIG. 29A).

Figure 29A:
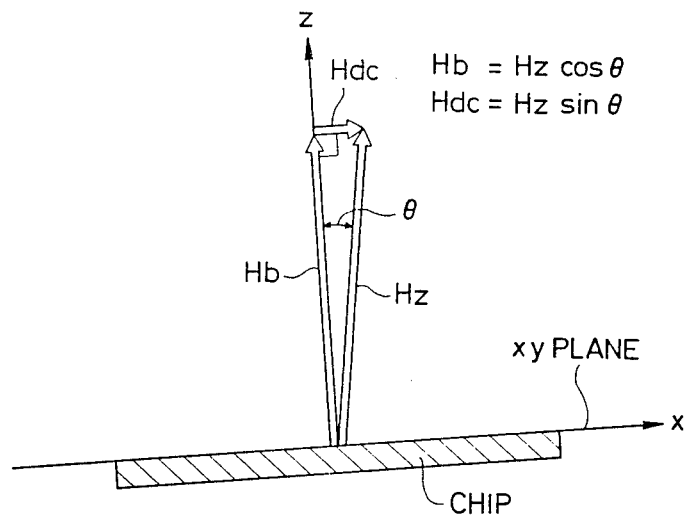
FIG. 29A is a view showing the relation between a bias magnetic field Hb and a holding magnetic field Hdc.

As shown in FIG. 29A, on account of the slant at a $\theta$ degrees angle between the magnet body BIM and the chip CHI, the series magnetic field Hz is made to have a component Hdc on the xy plane. And magnitude of this in-plane component Hdc is Hcd·sin $\theta$ and usually, the slanting angle $\theta$ is selected to be $Hdc \cdot \sin \theta = 5(Oe) - 6(Oe)$. Further, the direction of this in-plane component Hdc is slanted to coincide with the start and stop (St/Sp) direction in the revolving magnetic field Hr(+x-axis direction). This component Hdc on this xy plane is a well-known magnetic field effectively served as the start and stop (St/Sp) operation of the revolving magnetic field Hr and called as a holding field. Further, magnitude of the bias magnetic field Hb vertically functioned on the chip CHI plane is made to be Hz·cos $\theta$.

Figure 29B:
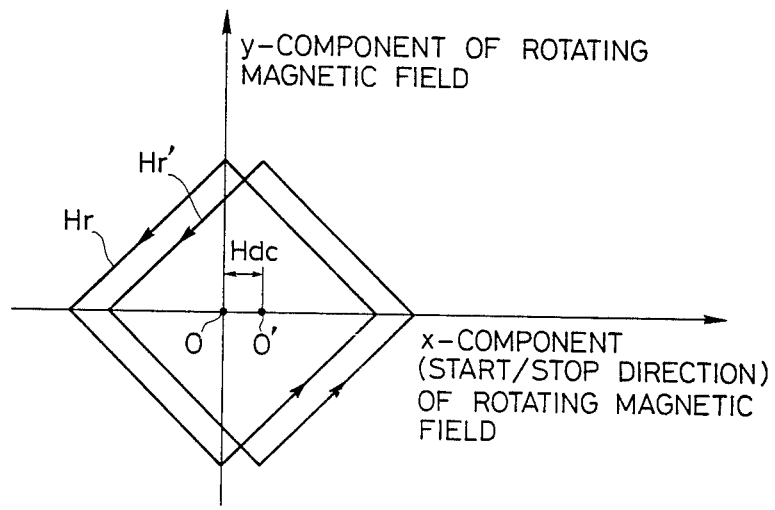
FIG. 29B is a view showing a total revolving magnetic field Hr'.

The above-stated holding field Hdc always functions on the xy plane of the chip CHI and thus the revolving magnetic field Hr' functioning to said chip CHI is made eccentric as illustrated in FIG. 29B. In this drawing, Hr denotes a revolving magnetic field applied from the external. Hr' denotes a revolving magnetic field functioning to the chip CHI. In this case, the revolving magnetic field Hr' functioning to the chip CHI is made to be a synthesis of the revolving magnetic field Hr applied from the external and the in-plane component Hdc and the center O' of the revolving magnetic field Hr' is shifted in parallel by the in-plane component Hdc in the start and stop (St/Sp) direction, that is, +x-axis direction. Thus, as is obvious from the result of FIG. 29B, if the intensity of the revolving magnetic field Hr applied from the external is |Hr|, the intensity |Hr'| of the revolving magnetic field effectively functioning to the chip CHI is variable in accordance with the phase of the revolving magnetic field Hr. Namely, |Hr'| in the St/Sp direction is made to be |Hr|+|Hdc|, which is more intensified by the intensity Hdc of the holding field Hdc in comparison with |Hr|. Conversely, |Hr'| in the opposite direction to the St/Sp direction is made to be |Hr|−|Hdc|, which is made weaker by |Hdc| in comparison with |Hr|.

Figure 30:
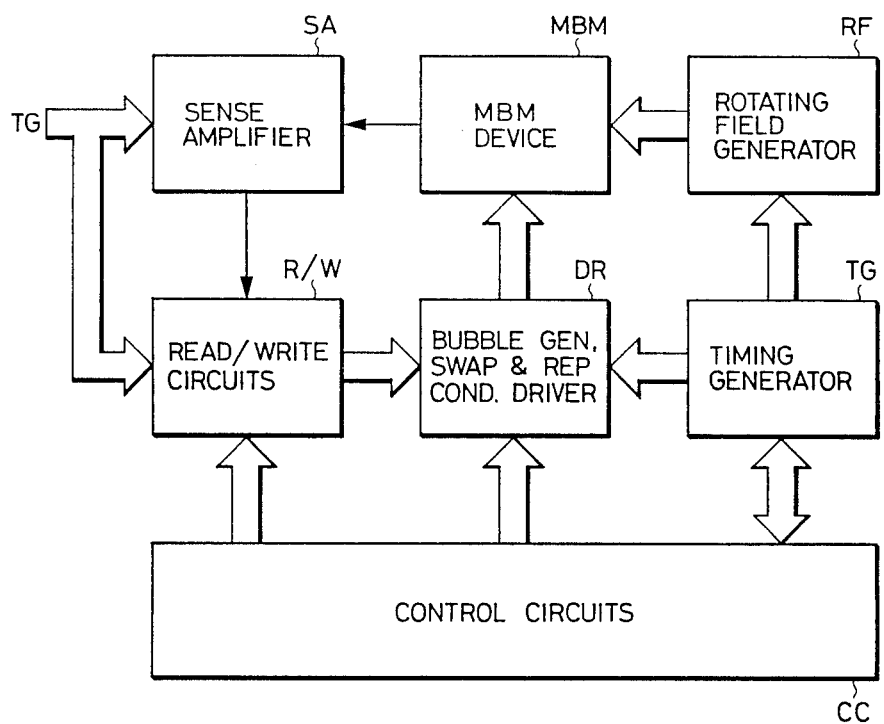
FIG. 30 is a view showing an overall circuit of a magnetic bubble board.

(Peripheral circuit; FIG. 30)

Lastly, a peripheral circuit of the chip CHI is described with reference to FIG. 30. RF denotes a circuit for generating a revolving magnetic field Hr by flowing the current whose phase difference is 90 degrees through the X- and Y-coils of the chip CHI. SA denotes a sense amplifier for sampling a minute bubble-detecting signal from the magnetic resistance element of the chip CHI in accordance with a timing of the revolving magnetic field, sensing and amplifying it. DR denotes a driving circuit for generating the bubbles in relation to the write in the magnetic bubble memory device MBM, flowing current through respective replicate functioning conductors in relation to swapping and reading in accordance with a predstermined timing and driving a bias coil BIC. The above-stated circuits are synchronized by means of a timing-generator TG so as to be operated in synchronization with a cycle and a phase angle of the revolving magnetic field Hr.

Figure 31:
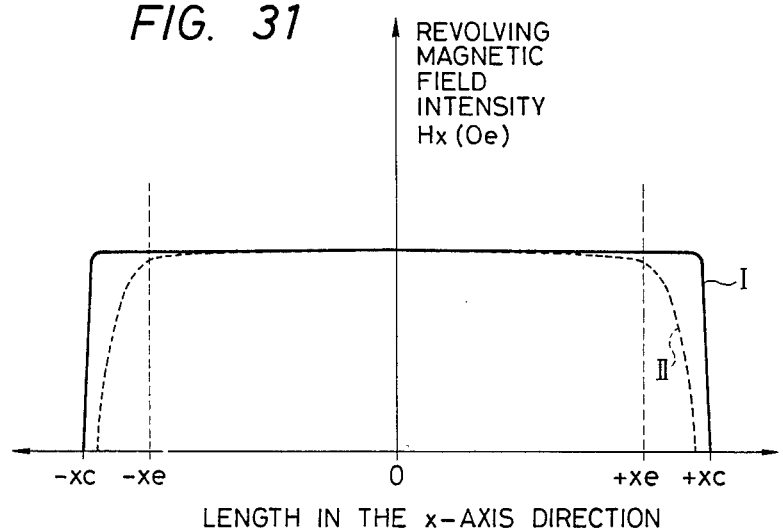
FIG. 31 is a characteristic view showing a revolving magnetic field distribution.

(Revolving magnetic field distribution characteristic, FIG. 31)

FIG. 31 shows a revolving magnetic field distribution characteristic of the above-stated magnetic circuit PFC. It means that in this Figure, when the axis of abscissas shows the length in the x-axis direction with 0 as the center of the magnetic circuit PFC shown in FIG. 8B and the axis of ordinates shows the revolving magnetic field intensity Hx in the x-axis direction in case of establishing the revolving magnetic field intensity in the x-axis direction Hx=0, the revolving magnetic field distribution characteristic as shown in the curve I can be obtained. As is obvious from this Figure, it is possible to obtain almost uniform revolving magnetic field intensity Hx in the range of $-Xc \sim +Xc$ of the distance between the insides of the core COR sides facing to each other in the magnetic circuit PFC and ±2% of uniformity of the magnetic field intensity in the range of $-Xe \sim +Xe$ of the effective area of the chip CHI (the minimal area to which a revolving magnetic field is to be applied). Further, the curve II shown by a broken line denotes a revolving magnetic field distribution characteristic.

(Modified embodiment 1)

In the next place, a series of embodiments shown in FIG. 1 thru FIG. 23 will be described in conjunction with FIG. 32 thru FIG. 45. Here, description about the configuration (material, structure and method) and the effect similar to those for FIG. 1 thru FIG. 23 are omitted.

(Modified embodiment 1 of the flexible substrate; FIG. 32)

FIG. 32 shows a modified embodiment of a flexible substrate. The flexible substrate FPC2 differs from that shown in FIG. 4 in such points as follows:

(1) Lead wires 100 are formed in four directions at 102a thru 102d where they were taken out of RFS, however, they are concentrated into two directions, left and right, at the connection parts (openings 104l and 104k of the film 101) with the ceramic substrate (FIG. 42) described later.

(2) The flexible substrate FPC2 is electrically connected through the external terminal (pin grid described with FIG. 42) without bending.

(3) Characteristic inspection at halfway steps of assembly has been made possible by providing an extension part 100d of the lead wire 100 on the flexible substrate FPC2. The terminal 109b can be checked with a probe.

(4) In order to make automatic assemble, etc., easy or to use the film substrate and production facilities of standard specifications in the industry, the width (longitudinal length in the drawing) of the film substrate 101 (FPC2) is limited to 35 mm (which is one of the reasons for concentrating lead wires in two directions as stated in the article (1)). Besides, feed holes 105a are provided on the film 101.

This film 101 is cut along the single-dot chain lines shown in the drawing, and unnecessary parts as the finished product are cut off. The substrate FPC2 has a copper foundation lead wire pattern which is formed by means of patterning with etching technique the copper film which is lined with epoxy system adhesive onto the base film composed of a polyimide resin film having the thickness of approsimately 50 μm. On the copper foundation lead wire layer, a Ni-plating layer and an Au-plating layer are formed successively by the electroplating method, etc. This Au-plating layer is provided for the purpose of preventing from the electrical migration of the copper layer or making the thermocompression bonding of the magnetic bubble memory chip CHI with the bonding pad easy. The Ni layer is used for the purpose of improving adherence between the copper layer and the Au-layer. The lead wire pattern 100 of each frame is connected at this stage by the frame-shaped pattern provided along the periphery shown in the drawing and the estended portion 100e, but it is for electroplating.

On one frame of the film substrate FPC2, the external connection parts 100c of lead wire 100 are concentrated in two directions as previously described. One of the reasons for the concentration in the left and right directions instead of upward and downward directions is to obtain compatibility with the 35 mm film described above. Another reason is as follows. The memory chip CHI is face-up bonded underneath the film substrate FPC2, but the substrate FPC2 and the chip CHI are inclined in left and right directions in the drawing as described later. (Under the same bias condition as FIG. 2B, inclination toward the right is arranged such that the left side is high and the right side is low with the magnet body as the reference.) Thus, the substrate FPC2 is not inclined in upward and downward directions. Therefore, when the film substrate and the chip CHI is electrically connected after bonding the chip CHI to a conductor case described later, uniform force is applied to the whole connection parts on the lefthand side and uniform bonding can also be made in the similar manner on the righthand side in bonding the connection part 100c between the film substrate FPC2 and the chip with the pad of the chip CHI. The same applies to the connection between the film substrate FPC and the printed substrate described later.

(Modified embodiments 1 of the case for confining a revolving magnetic field; FIGS. 33, 34 and 35)

Figures 33A, 33C:
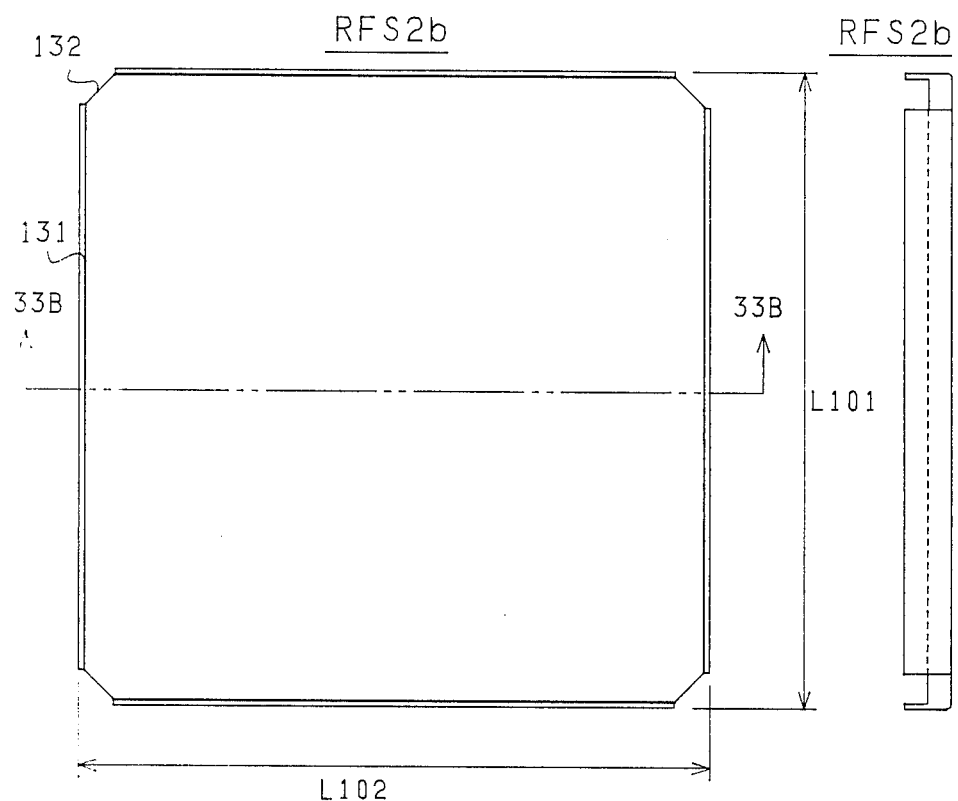
FIG. 33A is a plan view.
Figure 33B:
FIG. 33B is a sectional view taken on the line 33B—33B of FIG. 33A.

FIG. 33 shows the inner case RFS2b. FIG. 33A is a plan view, and FIG. 33B is a sectional view taken on the line 33B—33B of FIG. 33A. This case RFS2b is different from that shown in FIG. 10 in such points that the drawing section is omitted and the bottom plate thickness gets thicker as getting closer to the righthand side.

As shown in FIG. 33B, the lower surface of the bottom plate is tapered lowering toward the right at an angle of 1.7 degree against the upper surface. As seen from FIG. 38B, a plate HOM for homogenizing a magnetic field and the magnetic body of a permanent magnet are provided on the upper surface and the chip CHI is arranged on the lower surface. In other words, the inclination of thickness is provided for the purpose of giving to the chip CHI a holding magnetic field Hdc due to the inclination between the magnetic body and the chip CHI. The inclined surface of the conductor case described above is formed by means of press work with about 300 tons (inclined padding process). As other forming method, such inclined suface may be formed either by cutting or by tilting a roller during rolling process.

Since the operation of bending the film substrate along the drawing section will no longer be performed due to omission of the drawing section as shown in FIG. 10, the stress applied to the film substrate is lightened. Furthermore, since an inclined surface is provided on the conductor case RFS2b itself, the inclined plates INM and INN shown in FIG. 14 (4 plates in total) are no longer required, thereby decreasing the number of components. The reduction in the number of components leads to reduction in material cost and assembly cost.

Figures 34A, 34C:
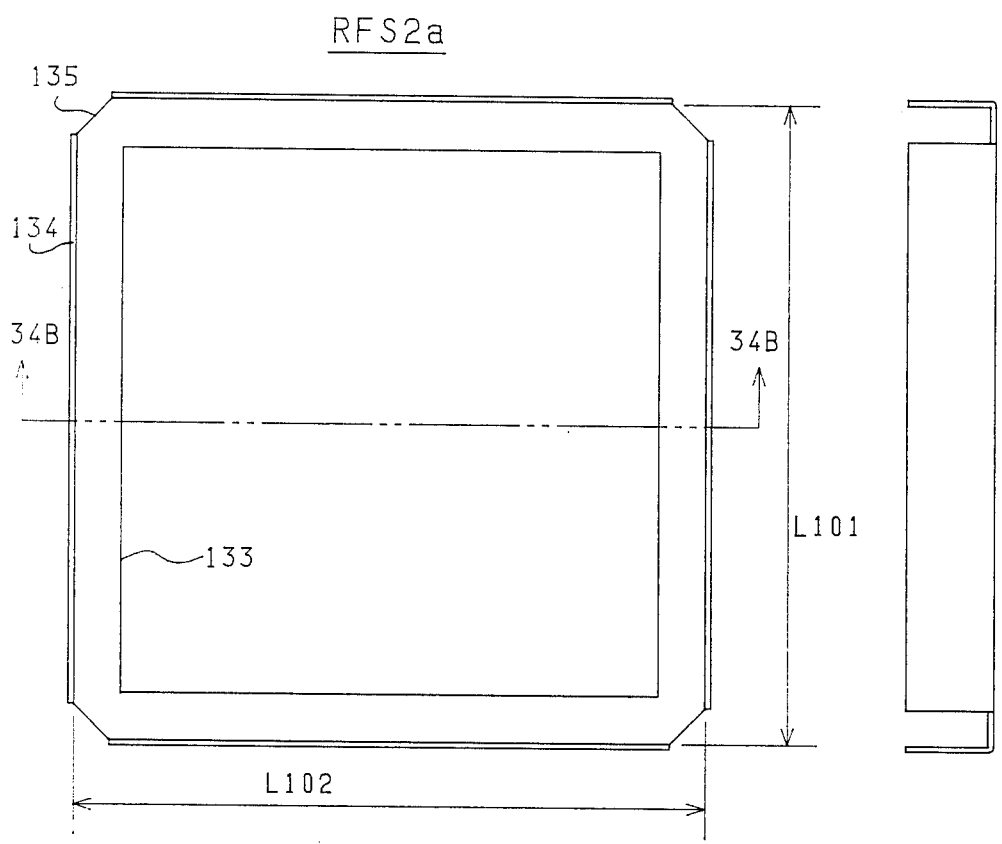
FIG. 34A is a plan view and FIG. 34B is a sectional view on the line 34B—34B.
Figure 34B:
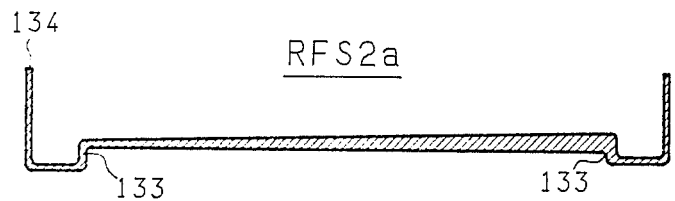
Figure 35A:
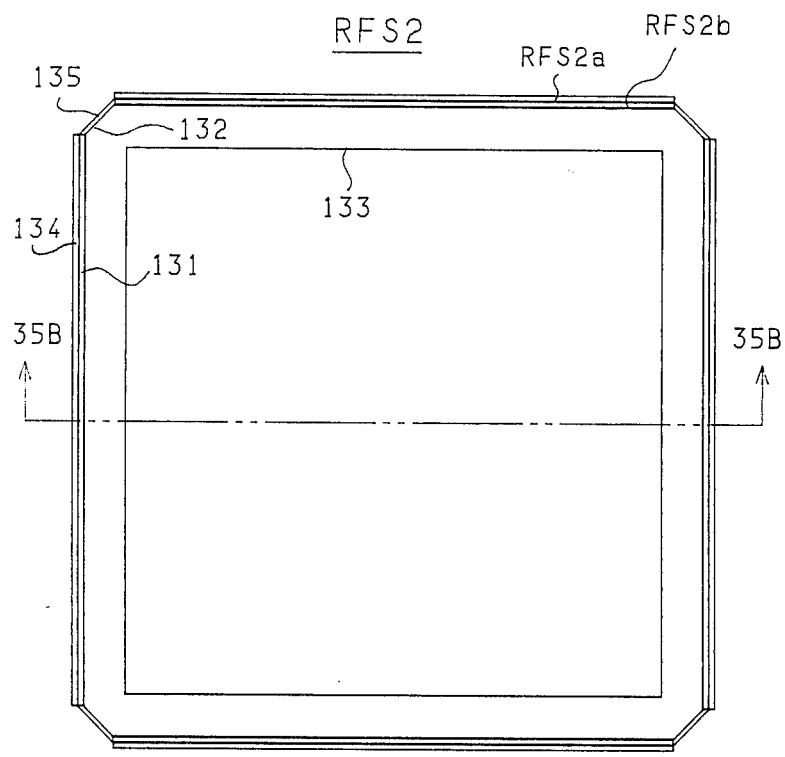
FIG. 35 includes FIGS. 35A and 35B showing the status of only the outer and inner cases RSF2a and RFS2b assembled together.
Figure 35B:
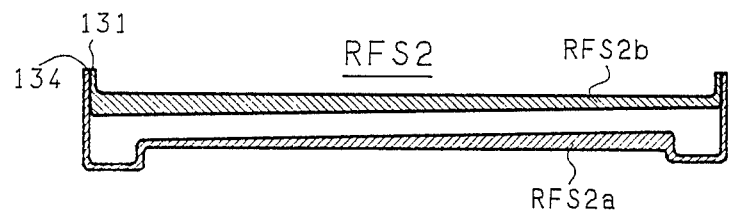

FIG. 34 shows the outer case RFS2a. FIG. 34A is a plan view and FIG. 34B is a sectional view on the line 34B—34B. The difference of the outer case RFS2a from the inner case RFS2b exists in that it has a drawing section 133 for containing or fitting the magnetic core PFC. On the upper surface of the bottom plate of the outer case RFS2a, a tapered surface lowering to the right which is similar to the lower surface of the bottom plate or the inner case RFS2b is provided.

FIG. 35 shows the status of only the outer and inner cases RFS2a and RFS2b assembled together (The chip CHI, the film substrate FPC2 and the magnetic core PFC are omitted in the drawing in the same way as FIG. 12). FIG. 12A is a plan view and FIG. 12B is a sectional view taken on the line 35B—35B.

(Modified embodiment 1 of the case assembly; FIG. 36)

FIG. 36 shows the status of the chip CHI, the flexible substrate FPC2, and the magnetic circuit PFC accommodated in the outer case RFS2a (the status before covering up with the inner case RFS2b). FIG. 36A is a plan view and FIG. 36B is a sectional view taken on the line 36B—36B.

The chip CHI is mounted on the substrate before being accommodated in the case RFS2a. When the surface of the flexible substrate FPC2 on which the lead wire 100 is located is called the front surface, the chip CHI is mounted on the back of the flexible substrate FPC2 keeping the main surface up (face up), on which bonding pads, lead wires and the transport path are located. It is needless to say that connection is made at the lead wire part 100a of the substrate FPC2 and the pad area of the chip CHI, but both are bonded by means of thermocompression of the lead wire part 100a on the pad with toolings such as a capillary.

After bonding, the film substrate 101 consisting of plurality of substrates FPC2 is separated into individual substrate FPC2, and unnecessary lead wire parts and reinforced area which were used in plating the periphery are cut off as shown in FIG. 36A.

The conductor case RFS2a is applied with adhesives such as epoxy system resin by a stamping method, where the back of the chip CHI which was bonded on the film substrate FPC2 is adhered. The relation at this time between the locations of the chip CHI and the case RFS2a can be determined precisely by means of the cut-away section 135 of the case RFS2a and external connecting sections 102a thru 102d. If necessary, more fine positioning adjustment is feasible by using jigs, etc.

Then, the magnetic circuit PFC is housed in the groove formed by the drawing section 133 of the case RFS2a and the outside wall 134. Under such status, potting with silicone resin REG2 is performed around the chip CHI. The silicon resin REG2 increases its fluidity by heating treatment and gets into between the back of the flexible substrate FPC2 and the main surface of the chip CHI by means of the capillary action, thereby protecting the chip CHI against adhesion of dust and permeation of moisture.

The height of the case RFS2a at the drawing section 133 is determined so that the flexible substrate FPC2 will be flat all over the inside of the case as shown in FIG. 36B taking the thickness of the magnetic circuit FPC and the thickness of the chip CHI into consideration. Thereafter, the case RFS2b is welded by the ultrasonic welding method at its surface contact part with the case RFS2a.

(Modified embodiment 1 of the magnet body; FIG. 37)

Figures 37A, 37B:
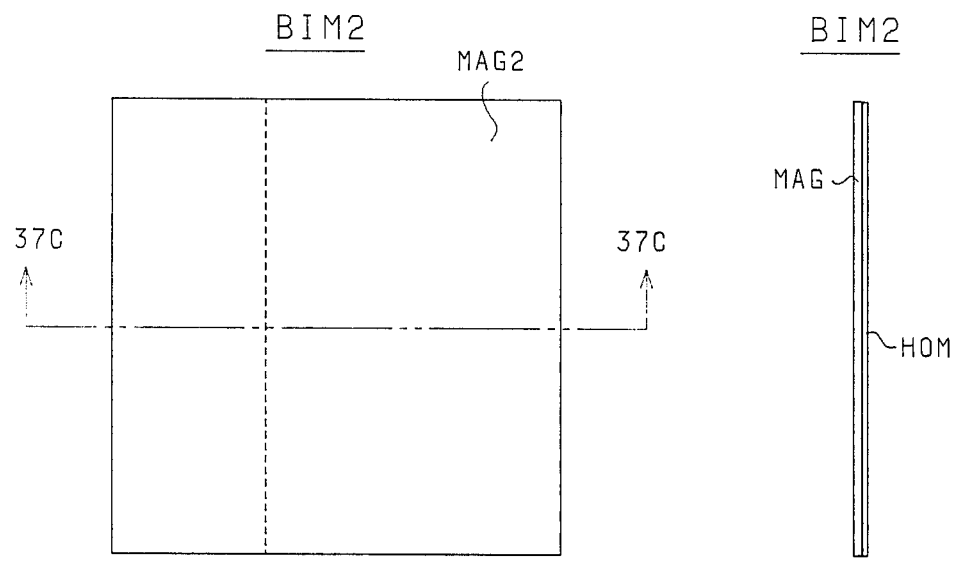
FIG. 37A is a plan vies.
FIG. 37B is a side view and FIG. 37C is a sectional view taken on the line 37C—37C.
Figure 37C:
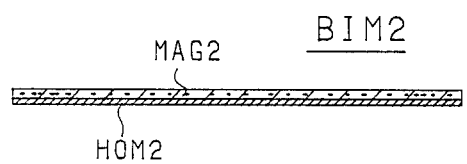

FIG. 37 shows the magnet body BIM2. FIG. 37A is a plan vies, FIG. 37B is a side view and FIG. 37C is a sectional view taken on the line 37C—37C. The magnet body BIM 2 shown differs from that (BIM) shown in FIG. 14 in such a point that inclined plates INM and INN are omitted.

(Modified embodiment 1 of mounting of the magnet body and the bias coil to the case assembly; FIG. 38)

FIG. 38 shows the status of the magnet body BIM2 shown in FIG. 37 and the bias coil BIC shown in FIG. 15 accommodated in the case assembly RFS2 described with reference to FIG. 36. FIG. 38A is a plan view and FIG. 38B is a sectional view taken on the line 38B—38B.

The upper magnet body BIM2a and the bias coil BIC are mounted on the plate-shape inner case RFS2b, and the lower magnet body BIM2b mounted on a flat part surrounded by the drawing section 38 of the outer case RFS2a.

(Modified embodiment 1 of mounting of the magnet body and the bias coil to the case assembly; FIG. 38)

FIG. 38 shows the status of the magnet body BIM2 shown in FIG. 37 and the bias coil BIC shown in FIG. 15 accommodated in the case assembly RFS2 described with reference to FIG. 36. FIG. 38A is a plan view and FIG. 38B is a sectional view taken on the line 38B—38B.

The upper magnet body BIM2a and the bias coil BIC are mounted on the plate-shape inner case RFS2b, and the lower magnet body BIM2b is mounted on a flat part surrounded by the drawing section 38 of the outer case RFS2a.

As seen from FIG. 38B, the chip CHI and the magnetic circuit PFC are inclined in left and right directions with reference to a parallel surface formed by upper and lower magnet bodies BIM2a and BIM2b. Besides, the condition for arranging the magnetic circuit PFC and the chip CHI in parallel remains unchanged from those embodiments shown in FIG. 13 and FIG. 16, but the thickness of the chip CHI, the thickness of the magnetic circuit PFC and the height of the drawing section 38 of the outer case RFS2a are designed so that the uppermost end surface of the magnetic circuit PFC and the upper surface of the chip CHI are almost even with each other, thereby preventing from application of the stress to the flexible substrate FPC2.

(Modified embodiment 1 of the magnetic shield case; FIG. 39, FIG. 40)

Figures 39A, 39B:
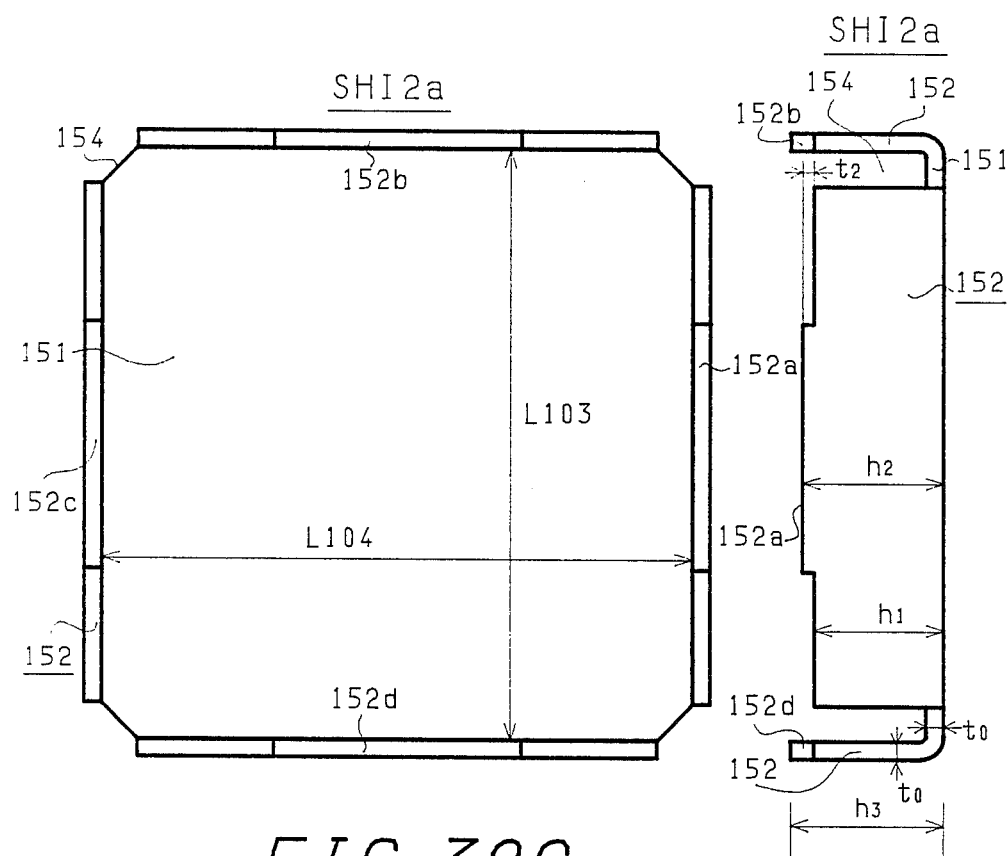
FIG. 39A is a plan view.
FIG. 39B is the right side view and FIG. 39C is the bottom side view.
Figure 39C:
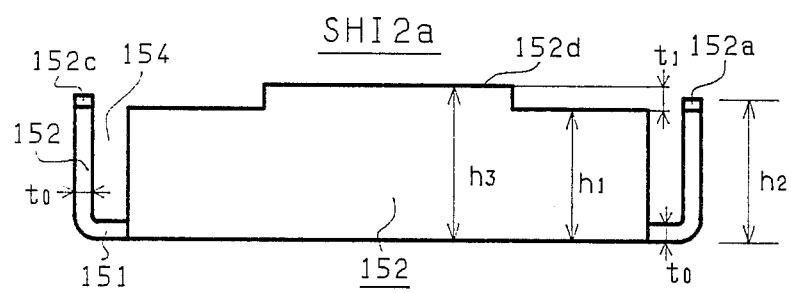

FIG. 39 shows the upper shield case SHI2a. FIG. 39A is a plan view, FIG. 39B is the right side view and FIG. 39C is the bottom side view. As seen from FIG. 39A, the plane figure of the upper shield case SHI2a is square in shape and is symmetrical for any axis of four center lines passing the same point (not shown), horizontal, vertical, and going up and down at 45° toward the right. The cut-away sections 154 at four corners making a right angle with the 45° center lines are provided for the purpose of having lead wire portions 102a thru 102d pass through at the four corners of the film substrate FPC shown in FIG. 32. 151 denotes the plane section of the case, and 152 denotes the upright wall section. Protruded sections 152a thru 152d are provided at the center part of each side of the walls 152. The height of protruded sections 152a and 152c on left and right sides is to be $h_2$, and the height of protrusion itself $(h_2-h_1)$ is to be the same as the thickness $t_0$ of the lower shield case SHI2b shown in FIG. 40. Furthermore, the height of the protruded sections 152b and 152d on upper and lower sides is to be $h_3$, and the height of protrusion itself $(h_3-h_1)$ is to be slightly bigger than the thickness $t_0$ of the lower shield case SHI2b. For example, it is determined that $h_1=4.5$, $h_2=5.0$, $h_3=5.3$ and $t_0=0.5$ and arrangement is made so that the protruded sections 152b and 152d of upper and lower sides of the upper shield case SHI2a slightly $(h_3-h_1-t_0=0.3)$ protrude over the lower plane part of the lower shield case SHI2b when the upper and lower shield cases SHI2a and SHI2b are assembled, thereby making the positioning easy with the ceramic printed substrate shown in FIG. 42. (The unit for each value is mm.)

Figure 40A:
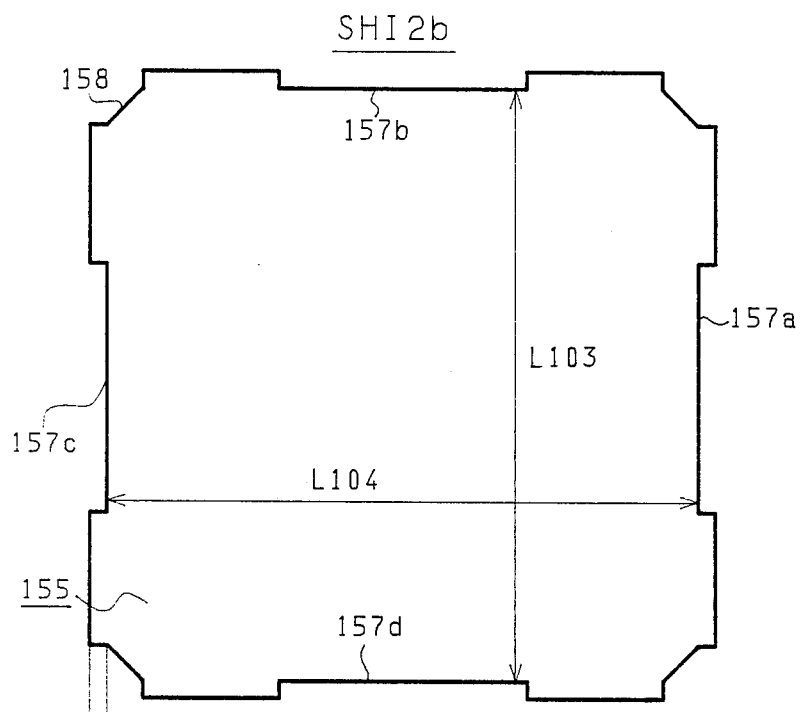
FIG. 40A is a plan view.
Figure 40B:
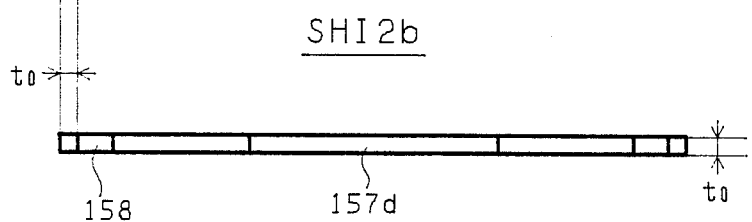
FIG. 40B is a lower side view.

FIG. 40 shows the lower shield case SHI2b. FIG. 40A is a plan view, and FIG. 40B is a lower side view. The plate-shaped lower shield case SHI2b has concave portions corresponding to the thickness $t_0$ of the wall 152 of the upper shield case SHI2a on four sides, left and right, and upper and lower, where protruded sections 152a thru 152d of the upper case are fitted. The length in longitudinal and horizontal directions L103 and L104 of each case shown in FIG. 39 and FIG. 40, respectively, are designed same, for example, at 22.4 mm.

The lower shield case SHI2b does not require bending process comparing with that (SHIb) shown in FIG. 18. This results in not only cost reduction but also small thickness of the finished device.

(Modified embodiment 1 of the magnetic shield case assembly; FIG. 41)

FIG. 41 shows the magnetic shield cases SHI2a and SHI2b shown in FIG. 39 and FIG. 40 packaged therein with the intermediate assembly shown in FIG. 38. FIG. 41A is a plan view and FIG. 41B is a sectional view taken on the line 41B—41B.

The assembly shown in FIG. 41 still includes terminals 109a, 109b, and extended portion of lead wires for plating that are not required for the final assembly, however, it is possible to perform the operation test and selection of acceptable products for the intermediate assembly at this stage, thereby reducing the average assembly cost per device.

Besides, the continuity test and the short-circuit test between the film substrate FPC2 and the chip CHI are performed after face-up bonding previously described and at the stage when the conductor case RFS2, etc. has been assembled, respectively.

The upper and lower shield cases RFS2a and RFS2b are welded together by the spot welding method or the laser welding method.

(Pin grid terminal substrate; FIG. 42)

FIG. 42 shows a substrate for electrically connecting the shield case assembly shown in FIG. 41 to the pin grip external connecting terminal. FIG. 42A is a plan view, FIG. 42B is a sectional view taken on the line 42B—42B, and FIG. 42C is a bottom view.

The ceramic substrate 201 provided with lead wires 205 thereon includes the upper thruhole connection terminals 206, the thruholes 207 and the lower thruhole connection terminals 208. The other end 205a of the lead wires 205 shows the portion where the outer lead portion 100c of the flexible substrate FPC2 is connected. The external connection pins 204 arranged in grid shape are connected electrically with the upper terminals 206 through conductive layers formed in the thruholes 207. Among the lead wires 205, those that are a little thicker than others are for connecting X coil, Y coil and bias coil (2 terminals each of Ix, Iy and Ib).

202 denotes a ceramic plate, on which the lower shield case SHI2b is adhered with epoxy resin, etc. That is, this ceramic plate 202 fulfils the duties of an insulation plate which prevents from short-circuit of the lead wire portion 205b by the lower shield case SHI2b which is to be positioned thereon. Furthermore, the ceramic plate 202 includes the concave portions 202b, 202d, where abovesaid protruded sections 152b, 152d of the upper shield case SHI2a are fitted in, thus also serving to the positioning in case of adherence of the shield case assembly. The ceramic substrate 201 and the ceramic plate 202 are put in layers under the condition of green ceramics and are sintered thereafter.

203 denotes a frame-shaped sealing ring, which is adhered to the edge of the ceramic substrate 201 by silver brazing alloy material, etc., and it is arranged such that the packaging cap PKG2 described later is welded to the portion protruding outside from the substrate 201.

For the material of the frame 203 and the grid pin 204, Fe.Ni.Co alloy (popular name: KOVAR) which has the coefficient of thermal expansion close to ceramics is selected.

On the portion of the ceramic substrate 201 where lead wires 205, terminals 206, 208, thruholes 207 and frames 203 are brazed, double metalized layers are formed. After two ceramic members 201, 202 are sintered, the grid pins 204 and the frame 203 are brazed to the ceramic substrate 201 with silver brazing alloy material. The double metalized layers have such function as to increase the adhesive strength. Under such status, Ni and Au layers are electroplated successively on the pin grid substrate TEF2, i.e., on the exposed double metalized layers and KOVAR material. The Ni layer is provided for the purpose of increasing the adhesive strength between the doubled layer and the Au layer. The pins 204 are composed of KOVAR material, but since they are Au plated, the solderability related to packaging on the printed substrate, etc. by users is improved. The Au plated layer at the end portion 205a of the lead wire 205 makes the thermocompression bonding with Au plated outer lead 100c of the film substrate FPC2 possible. The Au plated layer of the frame 203 is useful for hermetic encapsulation of the packaging cap PKG2 described later.

On the back of the ceramic substrate 201, a double metalized layer, i.e. an Au plated layer is formed a little wider than the adhered surface between the frame 203 and the pin 203 as shown with contour lines 209, 208 and no gap is arranged to exist on the adhered boundary surface by silver brazing alloy, etc., which achieves hermetic encapsulation along with the use of ceramics material and the packaging cap PKG2 described later.

Besides, Au plating layer is not formed at the area 205b of the lead wire 205 located underneath the ceramic plate 202. However, since the pitch between the lead wires is wider than the film substrate FPC2 described previously, there is no problem of electric migration.

(Pin grid substrate assembly; FIG. 43)

Figure 43A:
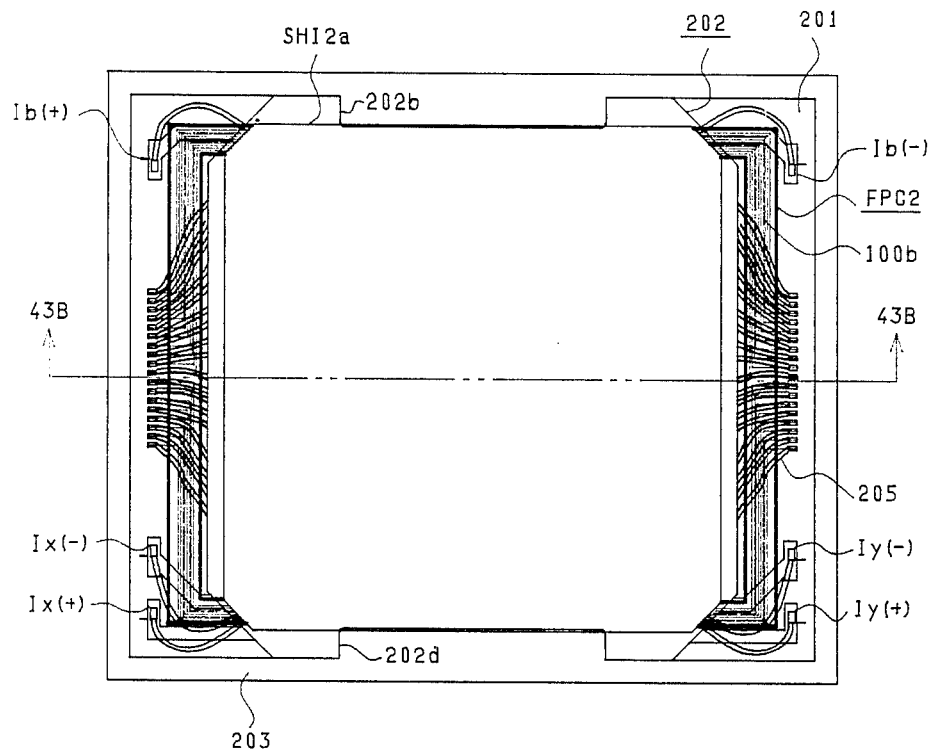
FIG. 43A is a plan view and FIG. 43B is a sectional view taken on the line 43B—43B.
Figure 43B:
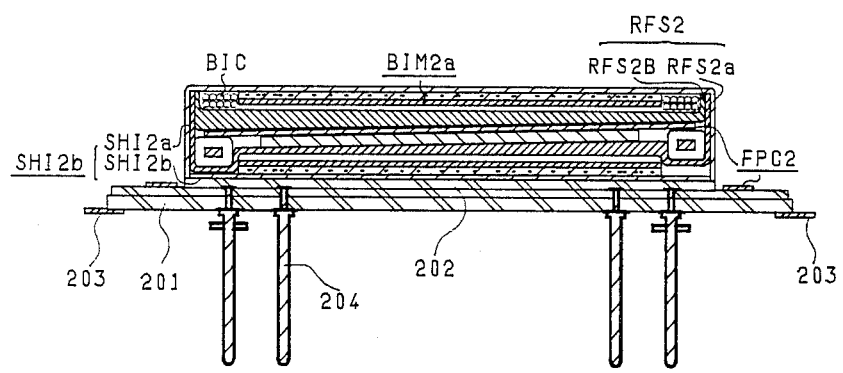

FIG. 43 shows the status when the shield case assembly shown in FIG. 41 is packaged on the pin grid substrate TEF2 shown in FIG. 42. FIG. 43A is a plan view and FIG. 43B is a sectional view taken on the line 43B—43B.

It has been described with reference to FIG. 42 how to form the assembly, so such description is omitted here.

(Modified embodiment 2 of the packaging cap; FIG. 44)

Figure 44A:
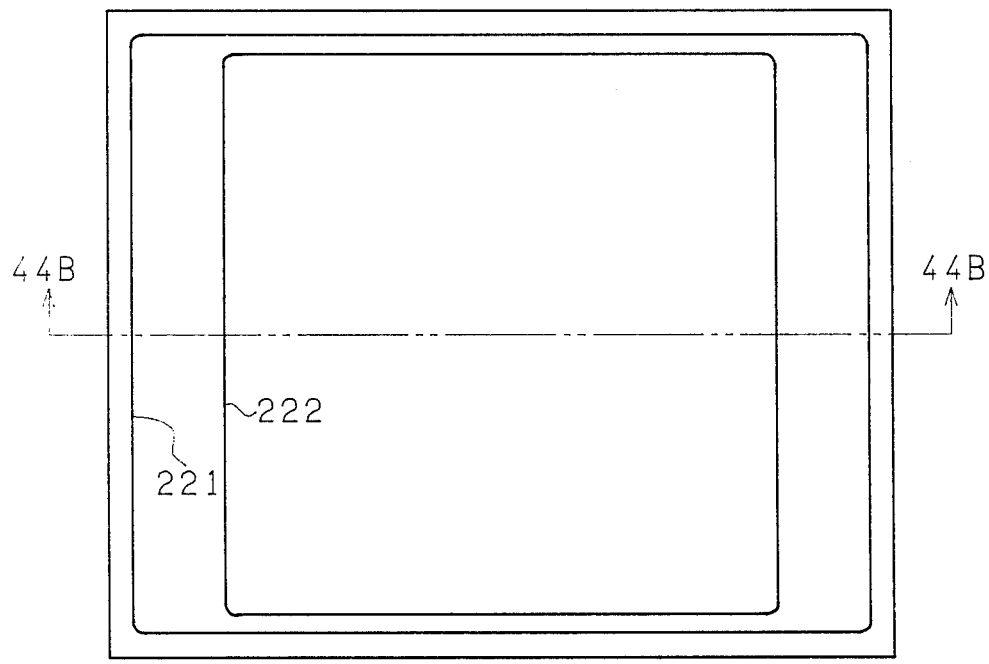
FIG. 44A is a plan view.
Figure 44B:
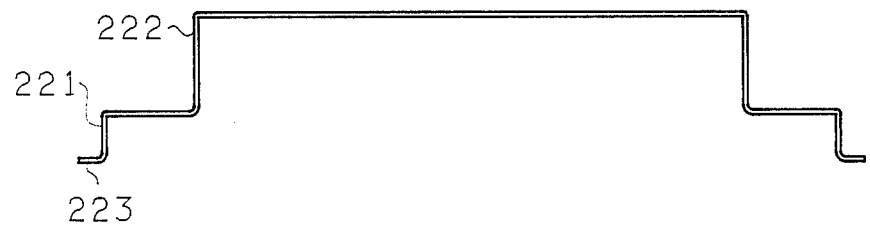
FIG. 44B is a sectional view taken on the line 44B—44B.

FIG. 44 shows an encapsulation cap. FIG. 44A is a plan view, and FIG. 44B is a sectional view taken on the line 44B—44B.

The cap PKG2 made of KOVAR has two wall sections 221, 222, and the bending between two wall portions 221 and 222 is made so that the wall 222 almost contacts the upper shield case SHI2a as shown in FIG. 45 for the purpose of improving heat radiation capacity.

The bottom part 223 is welded to a portion exposed from the ceramic substrate 201 of the frame 223 made of KOVAR by the resistance welding method, etc. Accordingly, the step difference between the exposed portion of the frame 223 and the side of the ceramic substrate 201 is useful for positioning in fitting the cap PKG2.

(Modified embodiment 2 of the packaging cap; FIG. 44)

FIG. 44 shows an encapsulation cap. FIG. 44A is a plan view, and FIG. 44B is a sectional view taken on the line 44B—44B.

The cap PKG2 made of KOVAR has two wall sections 221, 222, and the bending between two wall portions 221 and 222 is made so that the wall 222 almost contacts the upper shield case SHI2a as shown in FIG. 45 for the purpose of improving heat radiation capacity.

The bottom part 223 is welded to a portion exposed from the ceramic substrate 201 of the frame 223 made of KOVAR by the resistance welding method, etc. Accordingly, the step difference between the exposed portion of the frame 223 and the side of the ceramic substrate 201 is useful for positioning in fitting the cap PKG2.

(Modified embodiment 1 of the finished device structure; FIG. 45)

FIG. 45 shows the finished structure of a series of modified embodiments described with reference to FIG. 32 thru FIG. 44, that is, the structure of the intermediate assembly shown in FIG. 43 encapsulated with the cap PKG2 shown in FIG. 44. FIG. 45A is a plan view, FIG. 45B is a sectional view taken on the line 45B—45B and FIG. 45C is a right side view.

(Modified Embodiment 2, FIG. 46)

The modified embodiment 1 is superior in the function of protecting the substrate FPC in the conductive shield case RFS, compared with the first embodiment. This is true because the conductive shield case RFS of the modified embodiment 1 is flat at its surface abutting the substrate FPC so that no stress is exerted on the substrate FPC. In the first embodiment, since the conductive shield case RFS has a step at its peripheral edge portion for receiving the magnetic circuit PFC, the substrate FPC is mounted along the step and is hence normally subjected to a deforming force.

This deformation of the substrate FPC of the first embodiment can be eliminated by making flat one of the outer and inner conductive shield cases RFSa, RFSb on which the substrate FPC is to be mounted. This is a modified embodiment illustrated in FIG. 46 in which the outer case RFSa is flat. In FIGS. 46 and 13, like reference numerals designate similar parts.

The modified embodiment 2 is different from the first embodiment of FIG. 13 in that the outer case RFSa, on which the substrate FPC is to be mounted, is flat at its substantially entire surface except bent sections 34 at four sides of the case RFSa. With the thus flat inner surface of the outer shield case RFSa which surface abuts the substrate FPC loading the chips CHI, it is possible to reduce a strain which is produced on the substrate FPC, especially at a lead bonding portion thereof.

Although in the modified embodiment 2 the flat section is provided on the outer case RFSa, it should be noted that the inner surface of the inner case RFSb may be flat if the substrate FPC is to be mounted on the inner case RFSb.

(Modified Embodiments 3 and 4, FIGS. 47 and 48)

In the modified embodiment 1, the holding magnetic field Hde to the chip CHI resulting from the inclination between the magnetic body BIM and the chip CHI is provided by the change in plate thickness of the shield case RFS. On the other hand, the holding magnetic field Hdc according to the first embodiment is given by inserting the inclined plate INN between the flat case RFS and the magnet MAG.

FIGS. 47 and 48 show modified embodiments 3 and 4, illustrating alternative ways of mutually inclining the chip CHI and the magnet MAG when providing the holding magnetic field Hde to the chip CHI. FIGS. 47 and 48 are cross-sectional views corresponding to FIG. 20 of the first embodiment, showing the parts upside down. Since the primary subject of the invention illustrated in FIGS. 47 and 48 is the structures of the case RFS and the magnetic body BIM with respect to the chip CHI, the bias coil BIC and the substrate FPC, which are impertinent to the subject, are not illustrated in FIGS. 47 and 48 for clarity. In FIGS. 47, 48 and 20, like reference numerals designate similar parts.

In FIGS. 47 and 48, RFSa and RFSb designate the outer case and the inner case, respectively, within which assembly the core COR and the coil COI which constitute the magnetic circuit PFC, and the chip CHI loading the above described substrate FPC (not shown here) are mounted. SHIa and SHIb designate the outer shield case and the inner shield case, respectively. The magnetic body BIM, which is composed of the inclined plate INM, the magnetic plate MAG and the magnetic field homonizing plate HOM, is inserted between the shield case RFS and the shield case SHI.

The case RFS according to the modified embodiments 3 and 4 is different from that of FIG. 20 in that inclination establishing portions 200a, 200b are formed such as by squeezing the case plate to provide projections in FIG. 47 or by giving the case plate a varying thickness in FIG. 48. The angle of this inclination corresponds to the angle at which the magnetic plate MAG is disposed with respect to the chip CHI, being equal to the angle of the inclined plates INM, INN of FIG. 2B.

The inclination establishing portions formed by squeezing in FIG. 47 and preferably a small number of small projections rather than elongated projections extending perpendicularly to the sheet of drawing.

The modified embodiment 4 is similar to the modified embodiment 1 of FIG. 38B in that the case RFS is processed so as to have a varying plate thickness, and is different therefrom as to which is inclined, the chip CHI or the magnetic MAG. This difference causes another difference as to whether the inclined plate INM is necessary to the magnetic body BIM.

According to the present invention, because the air gap created between the shield case SHI and the magnetic plate MAG due to the inclination between the chip CHI and magnetic plate MAG is filled by sqieezing the revolving-magnetic-field confining case RFS, or by giving the same a varying plate thickness, it is unnecessary to use the inclined plate INN of FIG. 1B, thus not only minimizing the number of parts, but causing improved assembling.

What is claimed is:
1. A magnetic bubble memory module comprising:
    (a) a rectangular annular core having two pairs of opposite sides wound by a pair of wires, respectively;
    (b) a magnetic bubble memory chip disposed at a position surrounded by said core;
    (c) a flexible substrate loading said magnetic bubble memory chip and electrically connecting the same for leading input and output signals to said chip out of a case for confining a revolving magnetic field, said revolving-magnetic-field confining case accommodating said core, said chip and said flexible substrate;
    (d) a pair of magnetic bodies mounted on upper and lower surfaces of said revolving-magnetic-field confining case; and
    (e) inclined portions formed on said revolving-magnetic-field confining case at positions at which said pair of magnetic bodies are mounted, said inclined portions causing said pair of magnetic bodies to be inclined at a predetermined angle to said chip in said case, said inclined portions of said case being provided by a varying plate thickness of said case.

2. A magnetic bubble memory module according to claim 1, wherein said varying plate thickness of said case is provided by pressed plate means of differing thickness.

3. A magnetic bubble memory module according to claim 1, wherein said case having said varying plate thickness is flat at at least its surface abutting said flexible substrate.

* * * * *